(12) United States Patent
Ono et al.

(10) Patent No.: US 7,670,673 B2
(45) Date of Patent: Mar. 2, 2010

(54) HEAT-RESISTANT, LIGHT-SHIELDING FILM, PRODUCTION THEREOF, AND APERTURE AND LIGHT INTENSITY ADJUSTING DEVICE USING THE SAME

(75) Inventors: Katsushi Ono, Ichikawa (JP); Yoshiyuki Abe, Ichikawa (JP); Yukio Tsukakoshi, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 136 days.

(21) Appl. No.: 11/984,938

(22) Filed: Nov. 26, 2007

(65) Prior Publication Data
US 2008/0213555 A1 Sep. 4, 2008

(30) Foreign Application Priority Data
Nov. 30, 2006 (JP) ............................. 2006-323368
Mar. 28, 2007 (JP) ............................. 2007-084119

(51) Int. Cl.
*B32B 15/04* (2006.01)
*B32B 15/08* (2006.01)

(52) U.S. Cl. .................. 428/215; 428/332; 428/192.26; 428/469; 428/655; 428/663; 428/668; 428/680; 204/192.26; D14/202

(58) Field of Classification Search ........................ None
See application file for complete search history.

(56) References Cited

U.S. PATENT DOCUMENTS 6,372,538 B1 * 4/2002 Wendt et al. ................. 438/95

| | | | |
|---|---|---|---|
| 2004/0013899 A1 * | 1/2004 | Abe | 428/655 |
| 2005/0224766 A1 * | 10/2005 | Abe | 252/500 |
| 2006/0088690 A1 * | 4/2006 | Arakawa et al. | 428/138 |
| 2006/0159854 A1 * | 7/2006 | Yanagimoto et al. | 427/331 |
| 2006/0165877 A1 * | 7/2006 | Yanagimoto et al. | 427/58 |
| 2006/0219988 A1 * | 10/2006 | Abe | 252/521.3 |

FOREIGN PATENT DOCUMENTS

| JP | 01-120503 | 5/1989 |
|---|---|---|
| JP | 02-116837 | 5/1990 |
| JP | 04-009802 | 1/1992 |
| JP | 2000-075353 | 3/2000 |

* cited by examiner

*Primary Examiner*—Jennifer McNeil
*Assistant Examiner*—Vera Katz
(74) *Attorney, Agent, or Firm*—Edwards Angell Palmer & Dodge LLP

(57) ABSTRACT

A heat-resistant, light-shielding film having high light shielding capacity, high heat resistance, high sliding characteristics, low surface gloss and high electroconductivity, and useful for optical device parts, e.g., shutter or aperture blades for digital cameras and digital video cameras, and aperture blades for adjusting light intensity for projectors; method for producing the film; and aperture and light intensity adjusting device using the film.

The heat-resistant, light-shielding film comprising a heat-resistant resin film base (A) resistant to 200° C. or higher, coated, on one or both sides, with an Ni-base metallic film (B) having a thickness of 50 nm or more by sputtering and then with a low-reflectivity film (C) of Ni-base oxide also by sputtering, and having a surface roughness (arithmetic average height Ra) of 0.1 to 0.7 μm.

23 Claims, 2 Drawing Sheets

HEAT-RESISTANT, LIGHT-SHIELDING FILM, PRODUCTION THEREOF, AND APERTURE AND LIGHT INTENSITY ADJUSTING DEVICE USING THE SAME

BACKGROUND OF THE INVENTION

1. Field of the Invention

The present invention relates to a heat-resistant, light-shielding film, method for producing the film, and aperture and light intensity adjusting device using the film, more specifically a heat-resistant, light-shielding film having high light shielding capacity, high heat resistance, high sliding characteristics, low surface gloss and high electroconductivity, and useful for optical device parts, e.g., shutter or aperture blades for aperture or lens shutter for digital cameras and digital video cameras, and aperture blades for adjusting light intensity for projectors; method for producing the film; and aperture and light intensity adjusting device using the film.

2. Description of the Prior Art

Reentry, shutter blades or aperture blades for cameras have been required to be lighter and have higher sliding characteristics as shutter speed increases, because they are subjected to starting/stopping cycles in a very short time. At the same time, they are basically required to have light shielding capacity, because they cover photosensitive materials, e.g., films, or front surfaces of imaging devices, e.g., CCDs, to shield light. Moreover, they are required to have sufficient lubricity for smooth motion of blades for which they are used, because a plurality of blades work while overlapping each other in optical devices. Still more, they are required to have a low surface reflectivity to prevent leakage of light between blades. Still more, they are required to be resistant to heat, because cameras for which they are used may evolve high temperature inside depending on service environments.

On the other hand, light-shielding films for light intensity adjusting aperture blades for liquid-crystal projectors as projectors for presentation or image viewing devices for home theaters or the like are required to have characteristics similar to those for digital cameras and digital video cameras, or in particular higher heat resistance.

The commercial light-shielding films described above are generally supported by a base of plastic film, e.g., polyethylene terephthalate (PET) film, or thin metallic plate of stainless steel (SUS), SK, Al or the like. When a light-shielding film supported by a metallic base is used as a shutter or aperture blade in a camera, the metallic plates will graze with each other as the blades are opened and closed to create large noise. The blade in a liquid-crystal projector is required to move at a high speed to reduce brightness changes when images are changed, with the result that the blades will graze with each other to repeatedly create noise. To operate the blades at a lower speed to reduce noise will produce unstable images, because light intensity adjustment may not sufficiently follow changed images.

Recently, light-shielding films have been mainly supported by a plastic film, in order to solve the above problems and to reduce the weight. Moreover, they are required to be electroconductive to reduce evolution of dust. Therefore, it is accepted that they are required to satisfy the characteristics of high light shielding capacity, high heat resistance, low surface gloss, high sliding characteristics, high electroconductivity and low soot evolution. Various film materials and structures have been proposed to satisfy the characteristics which light-shielding films are required to have.

For example, Patent Document 1 discloses a light-shielding film with a resin film, e.g., polyethylene terephthalate (PET) film, impregnated with fine, black, electroconductive particles of carbon black, titanium black or the like to provide the film with light-shielding capacity and electroconductivity, and is matting treated at least on one side to decrease surface gloss, wherein the fine black particles work to absorb light emitted from a light source, e.g., lamp, for high light-shielding capacity, low surface gloss and high electroconductivity.

Patent Document 2 discloses a light-shielding film with a resin film coated with a thermosetting resin layer containing a black pigment, e.g., carbon black, having light-shielding capacity and electroconductivity, lubricant and delustering agent to have light-shielding capacity, electroconductivity, lubricity and low surface gloss.

Patent Document 3 discloses a light-shielding material comprising a metallic blade material of aluminum alloy or the like, coated with a hard carbon film.

Patent Document 4 discloses a light-shielding blade structure with a plastic base coated and reinforced with a prepreg sheet of thermosetting resin containing carbon fibers on each side, to improve blade rigidity.

Light-shielding films have been widely used as light-shielding blade materials for optical devices, e.g., digital cameras, digital video cameras and liquid-crystal projectors. Recently, liquid-crystal projectors have been required to produce high-quality, bright images of high contrast in bright atmospheres, e.g., those in living rooms. As a result, a lamp as a light source produces high output for brighter images, which tends to increase temperature in an aperture device for light intensity adjustment. Light-shielding films for light intensity adjustment, when irradiated with light of high output, are placed in atmospheres in which they tend to thermally deform.

Light-shielding films with a base of polyethylene terephthalate or the like have been widely used because of their low specific gravity. However, polyethylene terephthalate has a low thermal deformation temperature and low mechanical strength, e.g., modulus of elongation, with the result that light-shielding blades of polyethylene terephthalate may be deformed by vibrations and shocks evolving in the service or braking period as output of light sources.

Moreover, light-shielding films are matting-treated by sand blasting to have low surface gloss and high sliding characteristics. This treatment brings another effect of improving image visibility by scattering incident light to decrease surface gloss. This treatment is considered to prevent deterioration of sliding characteristics, because of controlled growth of contacting area between the light-shielding films even when they come into contact with each other.

Digital cameras, digital video cameras and liquid-crystal projectors inevitably include a plurality of light-shielding films as shutter or aperture blades which work while overlapping each other. Light-shielding films which include an organic light-shielding material, lubricant and delustering agent have been subjected to severer service conditions, e.g., temperature or humidity, in digital cameras, digital video cameras and liquid-crystal projectors. In liquid-crystal projectors, in particular, temperature inside of their devices (light-intensity adjusting devices, aperture devices and so forth) is increasing to near 200° C., as output of light sources, e.g., lamps to produce images of higher brightness, increases, as discussed above. In these severe environments, the conventional light-shielding films described above show unfavorable conditions, e.g., deformation or discoloration, and cause practical problems.

Light-shielding films, when used at high temperature of 200° C. or higher, will be greatly deformed by heat, even when they have a fine irregular structure on the surface, with the result that they can no longer work at a high speed when they come into contact with each other, and have deteriorated sliding characteristics and surface gloss because they are grazing with each other more frequently irregularly. As a result, the devices in which they are used, e.g., digital cameras, digital video cameras or liquid-crystal projectors, may no longer exhibit their intended functions.

Matting treatment of a plastic film as a base forms fine irregularities on the surface to bring effects of improving adhesion between the base and coating film with which the base is coated and reducing surface gloss. Sand blasting, however, provides film surface roughness which depends on material and particle size of a shot material and pressure at which it is ejected, among others. A shot material of large particle size may be removed from the surface by an adequate method, e.g., washing or flushing with water. A shot material of fine particles smaller than 1 μm, on the other hand, cannot be completely removed, and the particles remain on the surface in no small quantity, even it is washed. The remaining shot material may cause separation of the film, e.g., light-shielding film of metal alloy formed on the base film, and also separation of the residual shot material from the film at high temperature to which the light-shielding film is exposed, because of a thermal stress created by differential thermal expansion coefficient between the shot material and film. These troubles can have adverse effects on the surrounding parts, and a device in which the film is used may no longer exhibit its intended functions.

Patent Documents

[Patent Document 1]: JP-A-1-120503

[Patent Document 2]: JP-A-4-9802

[Patent Document 3]: JP-A-2-116837

[Patent Document 4]: JP-A-2000-75353

SUMMARY OF THE INVENTION

It is an object of the present invention to provide a heat-resistant, light-shielding film having high electroconductivity with a base film having a finely irregular structure on the surface, useful for light intensity adjusting aperture blades for liquid-crystal projectors, which are exposed to high temperature in the service period, and for shutter and fixing blades for digital cameras, which are exposed to high temperature in the manufacturing period, showing little deterioration of sliding and surface gloss characteristics, high durability making the film resistant to deformation and discoloration, and resistance to separation of the film and shot material.

The inventors of the present invention have found, after having studied to solve the problems involved in the conventional techniques, that a heat-resistant, light-shielding film showing little deformation, keeping characteristics (high light-shielding capacity, low surface gloss, high sliding characteristics, noble color and low reflectivity) in high temperature environments of around 200° C. and useful for aperture members for digital cameras, digital vide cameras, liquid-crystal projectors and so forth by coating a heat resistant resin film as a base having a finely irregular structure on the surface with a light-shielding film of Ni-base metal having a specific thickness by sputtering and then with a low reflectivity film of Ni-base oxide also by sputtering, wherein a gas barrier film may be formed, as required, on the base before the light-shielding film.

The first aspect of the present invention is a heat-resistant, light-shielding film comprising a heat-resistant resin film base (A) resistant to 200° C. or higher, coated, on one or both sides, with an Ni-base metallic film (B) having a thickness of 50 nm or more by sputtering and then with a low-reflectivity Ni-base oxide film (C) also by sputtering, and having a surface roughness (arithmetic average height Ra) of 0.1 to 0.7 μm.

The second aspect of the present invention is the heat-resistant, light-shielding film of the first aspect, wherein the resin film base (A) is of at least one species of resin selected from the group consisting of polyimide, aramid, polyphenylene sulfide and polyether sulfone, and has a surface roughness (arithmetic average height Ra) of 0.2 to 0.8 μm.

The third aspect of the present invention is the heat-resistant, light-shielding film of the first aspect, wherein the Ni-base metallic film (B) comprises nickel as the major ingredient incorporated with at least one additive element selected from the group consisting of titanium, tantalum, tungsten, vanadium, aluminum and copper.

The fourth aspect of the present invention is the heat-resistant, light-shielding film of the third aspect, wherein the Ni-base metallic film (B) is incorporated with the additive element(s) at 1 to 18% by atom.

The fifth aspect of the present invention is the heat-resistant, light-shielding film of the first aspect, wherein the Ni-base oxide film (C) comprises nickel as the major ingredient incorporated with at least one additive element selected from the group consisting of titanium, tantalum, tungsten, vanadium, aluminum and copper.

The sixth aspect of the present invention is the heat-resistant, light-shielding film of the fifth aspect, wherein the Ni-base oxide film (C) is incorporated with the additive element(s) at 1 to 18% by atom.

The seventh aspect of the present invention is the heat-resistant, light-shielding film of one of the first to sixth aspects, wherein the Ni-base metallic film (B) is 50 to 250 nm thick, and the Ni-base oxide film (C) is 5 to 240 nm thick.

The eighth aspect of the present invention is the heat-resistant, light-shielding film of one of the first to seventh aspects, wherein the resin film base (A) is coated with the Ni-base metallic film (B) via a metal oxide film (D) as a gas barrier film formed by sputtering.

The ninth aspect of the present invention is the heat-resistant, light-shielding film of the eighth aspect, wherein the gas barrier film (D) is of Ni-base oxide film.

The tenth aspect of the present invention is the heat-resistant, light-shielding film of the eighth or ninth aspect, wherein the gas barrier film (D) is an oxide film comprising, as the major ingredient, at least one species of element selected from the group consisting of titanium, tantalum, tungsten, vanadium, molybdenum, cobalt, niobium, iron, aluminum and silicon.

The 11$^{th}$ aspect of the present invention is the heat-resistant, light-shielding film of one of the eighth to tenth aspects, wherein the gas barrier film (D) is 5 to 30 nm thick.

The 12$^{th}$ aspect of the present invention is the heat-resistant, light-shielding film of one of the first to 11$^{th}$ aspects, which has a surface resistance of 1000Ω/□ (ohm per square) or less.

The 13$^{th}$ aspect of the present invention is the heat-resistant, light-shielding film of the 12$^{th}$ aspect, which has a surface resistance of 100Ω/□ or less.

The 14$^{th}$ aspect of the present invention is the heat-resistant, light-shielding film of one of the first to 11$^{th}$ aspects, wherein the resin film base (A) is coated with the Ni-base metallic film (B) and Ni-base oxide film (C) formed on each side, the films (B) and (C) being disposed center-symmetrically on the resin film base (A).

The 15th aspect of the present invention is the heat-resistant, light-shielding film of 14th aspect, wherein the Ni-base metallic films (B) formed on both sides of the resin film base (A) have substantially the same metallic element composition, and so are the Ni-base oxide films (C).

The 16th aspect of the present invention is the heat-resistant, light-shielding film of the ninth aspect, wherein the resin film base (A) is coated with the Ni-base oxide gas barrier film (D), Ni-base metallic film (B) and Ni-base oxide film (C) formed in this order on each side, the films (D), (B) and (C) being disposed center-symmetrically on the resin film base (A).

The 17th aspect of the present invention is the heat-resistant, light-shielding film of 16th aspect, wherein the Ni-base oxide gas barrier films (D) formed on both sides of the resin film base (A) have substantially the same metallic element composition, and so are the Ni-base metallic films (B) and Ni-base oxide films (C).

The 18th aspect of the present invention is a method for forming the heat-resistant, light-shielding film of one of the first to 11th aspects, comprising steps for supplying the heat-resistant resin film base (A) having a surface roughness (arithmetic average height Ra) of 0.2 to 0.8 μm to a sputtering unit; for sputtering the resin film base (A) in an inert gas atmosphere to form the Ni-base metallic film (B) thereon; and for sputtering the Ni-base metallic film (B) with oxygen gas injected into the inert gas atmosphere to form the Ni-base oxide film (C) thereon.

The 19th aspect of the present invention is a method for forming the heat-resistant, light-shielding film of one of the eighth to tenth aspects, comprising steps for supplying the heat-resistant resin film base (A) having a surface roughness (arithmetic average height Ra) of 0.2 to 0.8 μm to a sputtering unit; for sputtering the resin film base (A) with oxygen gas injected into the inert gas atmosphere to form the gas barrier film (D) thereon; for sputtering the gas barrier film (D) in an inert gas atmosphere to form the Ni-base metallic film (B) thereon; and for sputtering the Ni-base metallic film (B) with oxygen gas injected into the inert gas atmosphere to form the Ni-base oxide film (C) thereon.

The 20th aspect of the present invention is the method of the 18th or 19th aspect, wherein pressure of the sputtering gas is kept at 0.2 to 1.0 Pa.

The 21st aspect of the present invention is the method of the 18th or 19th aspect, wherein the resin film base (A) is kept at 180° C. or higher in the sputtering period.

The 22nd aspect of the present invention is the method of the 18th aspect, comprising additional steps for supplying the heat-resistant, light-shielding film coated with the Ni-base metallic film (B) and Ni-base oxide film (C) on one side to a sputtering unit; and for sputtering the resin film base (A) to form the Ni-base metallic film (B) and Ni-base oxide film (C) in this order on the other side.

The 23rd aspect of the present invention is the method of the 19th aspect, comprising steps for supplying the heat-resistant, light-shielding film coated with the gas barrier film (D), Ni-base metallic film (B) and Ni-base oxide film (C) on one side to a sputtering unit; and for sputtering the resin film base (A) to form the gas barrier film (D), Ni-base metallic film (B) and Ni-base oxide film (C) in this order on the other side.

The 24th aspect of the present invention is the method of one of the 18th to 23rd aspects, wherein the resin film base (A) is set on a film transfer device in the sputtering unit after being reeled into a roll.

The 25th aspect of the present invention is a heat-resistant aperture which uses the heat-resistant, light-shielding film of one of the first to 17th aspects, formed into a desired shape.

The 26th aspect of the present invention is a light intensity adjusting device which uses the heat-resistant, light-shielding film of one of the first to 17th aspects.

The heat-resistant, light-shielding film of the present invention comprises a heat-resistant resin film base (A) having a surface roughness (arithmetic average height Ra) of 0.2 to 0.8 μm, coated with an Ni-base metallic film (B) (hereinafter sometimes referred to simply as metallic film) having a specific thickness and low-reflectivity Ni-base oxide film (C) (hereinafter sometimes referred to simply as oxide film), both by sputtering. As such, it secures denser surface conditions than a light-shielding film produced by a conventional coating procedure, and has improved surface wear resistance, friction resistance and electroconductivity. The heat-resistant, light-shielding film has the low-reflectivity Ni-base oxide film as the outermost film formed on the metallic film and can reduce high reflectivity of the metallic film.

The heat-resistant, light-shielding film of the present invention gives a light-shielding blade more advantageous than a conventional blade of a heat-resistant, light-shielding film comprising a metallic foil coated with a heat-resistant coating material. It is lighter, because it uses a resin film as the base, has improved sliding characteristics when mounted on an aperture blade or the like, and makes a motor by which it is driven compacter to reduced cost.

The metallic film and low-reflectivity oxide film can be formed by sputtering with the same target, which eliminates a step for exchanging the target set in the sputtering unit and allowing these films to be produced continuously to reduce the production cost. These films are disposed center-symmetrically on the heat-resistant resin film, a structure which prevents deformation of the light-shielding film caused by internal stresses in the film-making period, to improve their productivity.

Moreover, the metallic film and low-reflectivity oxide film for the present invention can have a denser structure when formed under optimized sputtering conditions. The dense outermost film prevents its separation while the heat-resistant, light-shielding film is exposed to a high temperature of around 200° C. while it is working. As a result, separation of a residual shot material used for surface matting treatment of the base film, e.g., sand blasting, can be prevented.

The heat-resistant, light-shielding film of the present invention is industrially advantageous, when used for fixing, shutter or aperture blades for digital cameras and digital vide camera, which are exposed to high temperature in the assembling period, e.g., reflow period, and also useful for apertures or aperture blades for light intensity adjusting devices for liquid-crystal projectors, which are required to show high heat resistance in the service periods.

NOTATION

Figure 1:
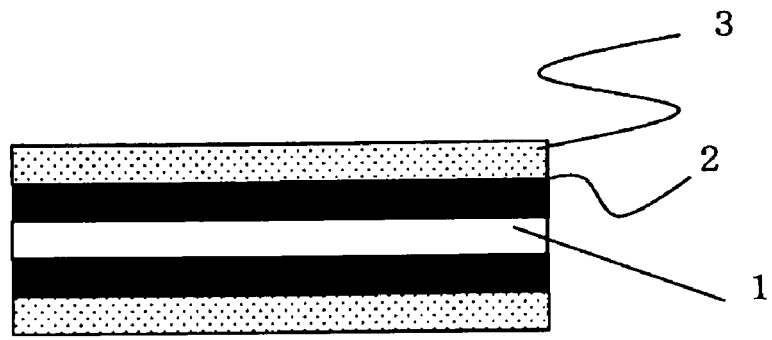
FIG. 1 is a cross-sectional view illustrating the heat-resistant, light-shielding film of the present invention.

1 Resin film base
2 Metallic film
3 Low-reflectivity oxide film
4 Roll from which a heat-resistant, light-shielding film is transferred
5 Vacuum pump
6 Vacuum chamber
7 Cooling can roll
8 Reeling roll
9 Magnetron cathode
10 Target
11 Diaphragm
12 Heat-resistant, light-shielding blade
13 Guide hole
14 Guide pin
15 Pin
16 Base
17 Hole
18 Opening

DETAILED DESCRIPTION OF THE INVENTION

Figure 2:
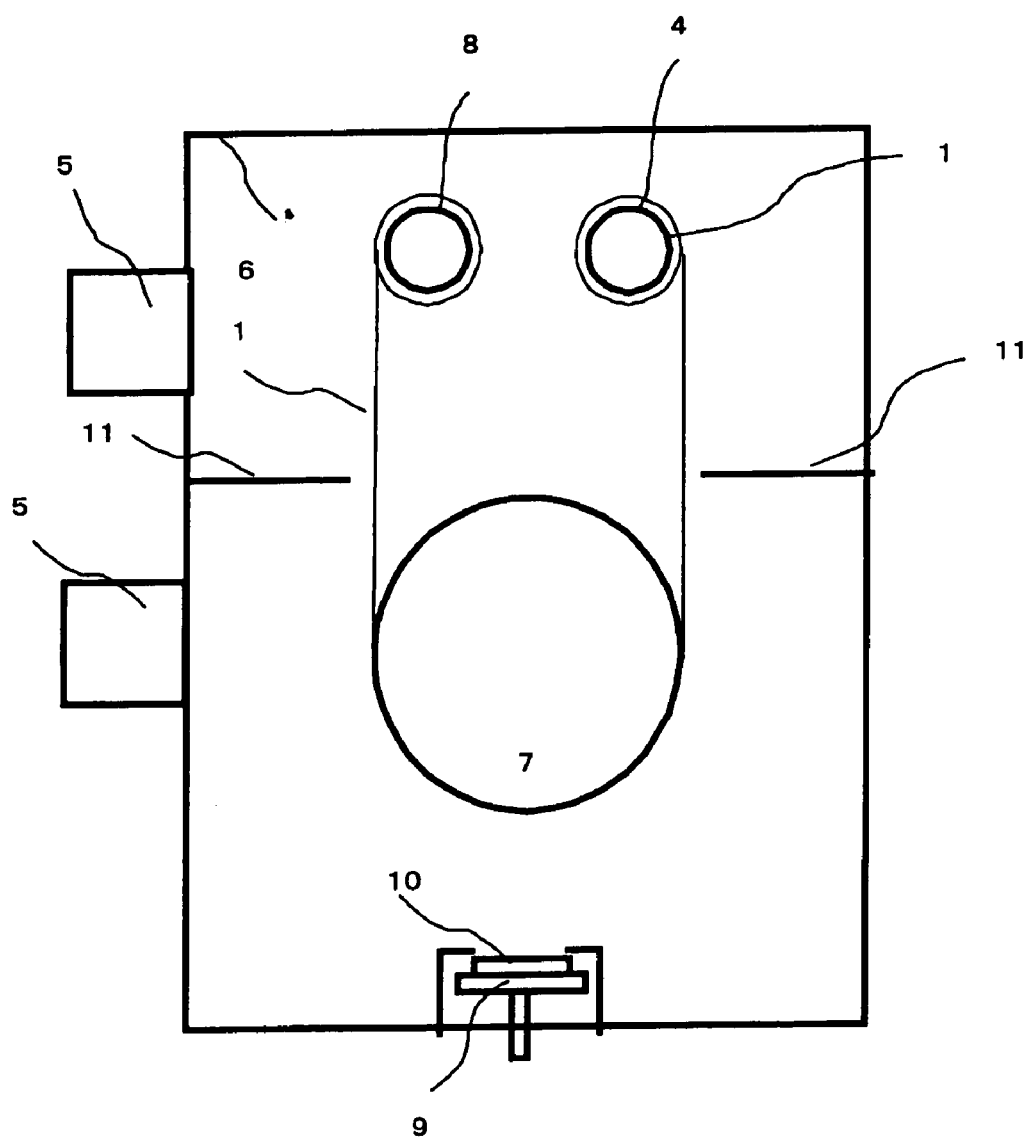
FIG. 2 illustrates one example of reel-equipped sputtering unit used for producing the heat-resistant, light-shielding film of the present invention.
Figure 3:
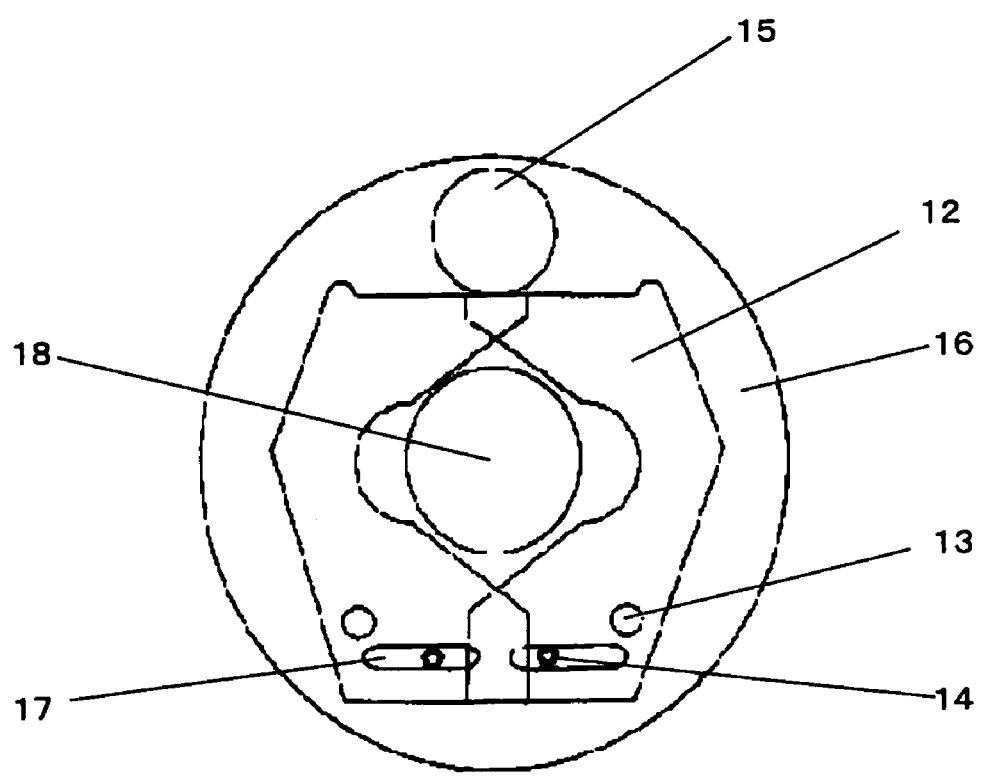
FIG. 3 schematically illustrates an aperture mechanism in which the heat-resistant, light-shielding film of the present invention is used.

The heat-resistant, light-shielding film, method for producing the same and aperture or light intensity adjusting device using the same, all of the present invention, are described by referring to the attached FIGS. 1 to 3.

1. Heat-Resistant, Light-Shielding Films

The heat-resistant, light-shielding film of the present invention comprises the heat-resistant resin film base (A) resistant to 200° C. or higher, coated, on one or both sides, with an Ni-base metallic film (B) having a thickness of 50 nm or more by sputtering and then with a low-reflectivity Ni-base oxide film (C) also by sputtering, and having a surface roughness (arithmetic average height Ra) of 0.1 to 0.7 μm.

FIG. 1 schematically illustrates a structure of the heat-resistant, light-shielding film of the present invention. The heat-resistant, light-shielding film of the present invention comprises the resin film 1 as the base, coated with the Ni-base metallic film 2 and low-reflectivity Ni-base oxide film 3, formed in this order. The heat-resistant, light-shielding film of the present invention has a surface roughness (arithmetic average height Ra) of 0.1 to 0.7 μm, preferably 0.2 to 0.7 μm, most preferably 0.3 to 0.6 μm. A surface roughness of below 0.1 μm is not desirable viewed from securing low surface gloss. On the other hand, a surface roughness above 0.7 μm is also not desirable, because the film tends to have surface defects.

The resin film 1 is preferably 12.5 to 125 μm thick. The film thinner than 12.5 μm tends to have flaws, folds and other surface damages, when it is not well handled. The film thicker than 125 μm, on the other hand, may be difficult to give a good aperture or light intensity adjusting device, in which a plurality of the films are mounted, because the device has been required to be compacter.

Thickness of the light-shielding Ni-base metallic film (metallic film) is not limited. However, it can be 30 to 280 nm, preferably 40 to 260 nm, more preferably 50 to 250 nm. The film thinner than 30 nm is not desirable, because it transmits some light and is difficult to realize a sufficient light-shielding capacity. The thickness above 280 nm, on the other hand, brings disadvantages, e.g., increased cost resulting from increased material cost and film-making time, and increased stresses in the film which tend to cause its deformation, although the film has a light-shielding capacity increasing as its thickness increases.

Thickness of the low-reflectivity Ni-base metal oxide film (oxide film) is not limited. However, the film can have a reduced reflectivity in the visible region when it has a thickness of 5 to 250 nm, preferably 20 to 240 nm, more preferably 30 to 200 nm. The thickness below 5 nm may be difficult to sufficiently reduce reflectivity and surface gloss. The film thicker than 250 nm an increased surface resistance and is also economically disadvantageous.

The Ni-base metallic film and low-reflectivity Ni-base metal oxide film may be formed on one side of the resin film base, but preferably on both sides. It is more preferable, when they are formed on both sides, that each of them has the same composition on the both sides and is disposed center-symmetrically on the film base. The thin film on the film base exerts a stress on the base and can deform the base. The stress-caused deformation may be observed in the as-coated film base, but more notably when it is heated to around 200° C. However, each of the coating films having the same composition on the both sides and disposed center-symmetrically can help keep stresses balanced even at a high temperature and the heat-resistant, light-shielding film flat.

In other words, it is preferable that each of the Ni-base metallic film (B) and low-reflectivity Ni-base metal oxide film (C) has substantially the same metallic composition on the both sides, and so are the gas barrier film (D), film (B) and film (C).

(A) Resin Film Base

It is essential for the resin film as the base for the heat-resistant, light-shielding film of the present invention to have a fine irregular structure on the surface, or an arithmetic average height Ra of 0.2 to 0.8 μm, in particular 0.3 to 0.7 μm. Arithmetic average height, or arithmetic average roughness, is determined by the following procedure: standard lengths in the average line direction in the roughness curve are sampled, and the absolute deviation values from the sampled average lines to the measured curve are averaged. The film having an Ra below 0.2 μm may not be sufficiently adhesive to the metallic film formed thereon, and also may no longer secure sufficiently low surface gloss or low reflectivity. The film having an Ra above 0.8 μm, on the other hand, may have too large irregularities on the surface to have a good metallic film in the indentations. It is not desirable costwise to coat the film heavily with the metallic film for securing a sufficient light-shielding capacity.

The resin film as the base may be transparent or colored with a pigment, so long as it has a heat resistance to 200° C. or higher. A film having a heat resistance to 200° C. or higher means that it has a glass transition temperature of 200° C. or higher, or it is not degraded at 200° C. or higher, when it shows no glass transition temperature. The resin for the film is preferably flexible to be processable by a sputtering-aided roll coating, viewed from mass productivity.

It is preferable that the heat-resistant film is of at least one species selected from the group consisting of polyimide (PI), aramid (PA); polyphenylene sulfide (PPS) and polyether sulfone (PES). However, it is not limited to the above so long as it has a heat resistance to 200° C. or higher. Of these resins, polyimide is particularly preferable, because it has a higher heat resistance temperature than the others.

The irregularities on the resin film surface are provided by surface treatment of the film. For example, matting treatment with a shot material is a simple procedure, although the surface treatment is not limited thereto. A fine, irregular structure can be also provided by nanoimprinting. Shot materials for matting treatment include sand, although not limited thereto. Matting treatment can provide irregularities on a film while it is being transferred. The irregularities of optimum Ra depends on film transfer speed during the matting treatment, and type and size of shot material type selected. These surface treatment conditions should be optimized to provide the film surface with irregularities having an arithmetic average height Ra of 0.2 to 0.8 μm. The matting-treated film is washed to remove the shot material and then dried. The film is matting-treated on both sides, when it is coated with the metallic film and low-reflectivity oxide film on both sides.

(B) Metallic Film

The heat-resistant, light-shielding film of the present invention is sufficiently resistant to heat to work at a high temperature of 200° C., which comes from the dense, oxidation-resistant metallic film and low-reflectivity oxide film, both prepared by sputtering, and also from good adhesion between the resin film and metallic film.

Metallic films generally have increased transparency as they are oxidized, and it is essential for a metallic film as a light-shielding film to have sufficient resistance to oxidation. The material for the metallic film for the heat-resistant, light-shielding film of the present invention is preferably selected from nickel-base materials for their high resistance to oxidation. More specifically, it may be pure nickel but is preferably a nickel-base alloy with nickel as the major ingredient which is incorporated with at least one additive element species selected from the group consisting of titanium, tantalum, tungsten, vanadium, aluminum and copper, because it is more resistant to oxidation than pure nickel. The metallic film incorporated with the above element(s) is more resistant to oxidation than pure nickel.

It is preferably incorporated with the additive element(s) at 1 to 18% by atom based on the total constituent elements, particularly preferably 5 to 14% by atom. The additive content beyond the above range is not desirable. The alloy incorporated with the additive element(s) at below 1% may be difficult to form a film by DC (Direct Current) magnetron sputtering with a cathode of common magnet of weak magnetic force, because it may not greatly reduce ferromagneticity of a nickel target. At above 18% by atom, on the other hand, an intermetallic compound(s) may be produced massively to make a sputtering target fragile, with the result that sputtering may not be carried out satisfactorily, because of possible cracking of the target by thermal stresses or the like evolving in the sputtering period. Moreover, the sputtering-produced metallic alloy film may be degraded.

A nickel-base target is more advantageous for sputtering with respect to productivity than other metallic targets, because it gives a film faster. For example, DC magnetron sputtering with a nickel target gives a nickel film 1.5 to 2 times faster than that with a titanium target to produce a titanium film under the same conditions.

The Ni-base metallic film may contain carbon or nitrogen. It may be incorporated with carbon or nitrogen when sputtered with a sputtering gas containing a carbon or nitrogen element, e.g., hydrocarbon gas or nitrogen gas. Instead, it may be incorporated with carbon or nitrogen element by sputtering with a target containing the element without using a sputtering gas containing the element. Incorporation of a Ni-base metallic film, in particular, with carbon or nitrogen is advantageous because it can further improve film heat resistance. The material for the metallic film for the heat-resistant, light-shielding film of the present invention can exhibit sufficient light-shielding and heat resistance characteristics, when incorporated with a carbide, nitride or carbonitride, e.g., nickel carbide, nickel nitride or nickel carbonitride by the above procedure. Moreover, it is incorporated with carbon or nitrogen also viewed from improved adhesion to the resin film. The metallic film for the present invention preferably contain oxygen at as far a low content as possible, viewed from securing high adhesion to the resin film and high light-shielding capacity. However, a sputtering gas may contain residual oxygen or the like to an extent that it causes no damages on metallic properties, light-shielding capacity and adhesion to the resin film of the metallic film incorporated therewith, partly or totally. The metallic film preferably contains oxygen at 5% or less by atom based on the total metal elements, particularly preferably 3% or less by atom viewed from securing adhesion of the film to the resin film.

The metallic film for the heat-resistant, light-shielding film of the present invention may be in the form of laminate composed of a plurality of dissimilar films with respect to composition (content or type of a metallic element, or carbon, nitrogen or oxygen content).

For adhesion, it is essentially difficult to secure high adhesion between a resin film base of an organic material and metallic film of an inorganic material, because they tend to be separated from each other at a high temperature of 200° C. resulting from differential thermal expansion, when adhesion is insufficient in the interface between them.

It is essential to keep high adhesion between them to avoid film separation resulting from differential thermal expansion. The Ni-base metallic film for the present invention can effectively prevent the separation troubles when it is incorporated with at least one additive element selected from the group consisting of titanium, tantalum, tungsten, vanadium, aluminum and copper. In the present invention, the resin film has a functional group of oxygen on the surface, and the metallic film contains an adequate quantity of titanium, tantalum, tungsten, vanadium, aluminum or copper, each being known to be amenable to oxidation. The metal reacts with the oxygen-containing functional group on the surface other to improve adhesion between the resin film and metallic film.

(C) Oxide Film

The heat-resistant, light-shielding film of the present invention also includes the low-reflectivity oxide film. The metallic film formed on the resin film base has a high reflectivity, but the heat-resistant, light-shielding film can have a reduced reflectivity by the low-reflectivity oxide film formed on the metallic film. The low-reflectivity oxide film may have a single-layer structure or multi-layered structure with layers of different composition with respect to oxygen content, or type or content of the additive element. Moreover, the low-reflectivity oxide film to be formed on the metallic film may be highly transparent, or low transparent and colored.

The low-reflectivity oxide film for the present invention is preferably composed of nickel as the major component, because it is highly resistant to heat and corrosion at a high temperature, and highly adhesive to the underneath metallic film, which is composed of the same ingredient of nickel.

More specifically, the oxide film may be substantially composed of nickel only as the metallic component, but preferably of an oxide with nickel as the major ingredient incorporated with at least one additive element selected from the group consisting of titanium, tantalum, tungsten, vanadium, aluminum and copper at 1 to 18% by atom, preferably 5 to 14% by atom.

The Ni-base oxide film preferably contains the same metallic component as the metallic film, which, however, is not essential, because the metallic film and low-reflectivity oxide film can be formed by same sputtering target and by a sputtering unit with the same sputtering cathode to reduce the production cost. Thickness of the oxide film with nickel as the major ingredient is not limited. However, the 5 to 240 nm thick film can have a reduced reflectivity in the visible region.

The Ni-base oxide film may contain carbon or nitrogen, in addition to the metallic elements described above. Carbon or nitrogen, when present, can adjust refractive index of the film to help realize low reflectivity. The oxide film having a low transmittance in the visible region (e.g., transmittance of the single film: 10 to 60%), such as a metal oxide film massively containing oxygen deficiencies, can realize a low reflectivity of 2% or less in a wavelength range from 380 to 780 nm, and give the heat-resistant, light-shielding film black in color. The black film of low reflectivity is particularly preferable when used for a device disposed on the lens unit side in a liquid-crystal projector or on the imaging element side in a digital imaging device, because a film strongly reflecting light, when disposed in the above side, may have adverse effects on the device by stray light created from the reflected light. The Ni-base oxide film may be in the form of laminate composed of a plurality of dissimilar films with respect to composition (oxygen, carbon or nitrogen content, or content or type of a metallic element). The laminate composed of layers different in composition, and hence different in refractive index and extinction coefficient, can exhibit a higher light-shielding effect and realize low reflectivity.

Thickness of the oxide film is not limited. However, the film having a thickness of 5 to 240 nm can have decreased reflectivity in the visible region. The film having a thickness below 5 nm may not have sufficiently decreased reflectivity and surface gloss. The film having a thickness above 240 nm, on the other hand, may have an excessive surface resistance, and is economically disadvantageous.

The heat-resistant, light-shielding film of the present invention can be provided with high reflection characteristics for heat ray, in order to avoid temperature rise as far as possible, when irradiated with the ray. In such a case, the oxide film is made of an oxide having as high a transmittance as possible in the visible to near-infrared region, contrary to the above, to suppress absorption of heat ray within the oxide film while utilizing high heat ray reflection characteristics of the metallic film. It is more preferable to realize high reflection characteristics by optimizing thickness of the oxide film, in which its refractive index is taken into consideration, to synergistically increase intensity of reflected near-infrared ray in the interfaces between the oxide film and metallic film and between the oxide film and outside. The heat-resistant, light-shielding film having the above structure for high heat ray reflection characteristics can have an adequate reflectivity of 3 to 7% as a maximum reflectivity in the visible region. Its reflectivity is preferably 7% or less, because reflected light may be straying to have adverse effects on the film when it is 10% or more. The heat-resistant, light-shielding film of the above structure can display red, purple, blue or yellowish soil color depending on wavelength characteristic of the reflected light, although its blackness decreases.

The heat-resistant, light-shielding film of the present invention comprising the resin film coated with the metallic film and oxide film on each side, wherein blackness and reflectivity on one side are designed to be different from those on the other side, may be effective for some purposes. For example, when the heat-resistant, light-shielding film of the present invention is used for a blade serving in the vicinity of a lamp in a projector, it is effective to have a structure of decreased blackness on the lamp side to have high light reflection characteristics for light in the visible to near-infrared region to take avoidance of heating by heat ray as a top priority, while having a structure of increased blackness on the other side to have low light reflection characteristics in the visible region to control creation of stray light. In this case, the Ni-base oxide film on the lamp side contains a smaller quantity of oxygen deficiency to increase transmittance and that on the other side contains a larger quantity of oxygen deficiencies to decrease transmittance.

Electroconductivity of a plastic film, which is electrically insulating, is an important property for preventing plastic light-shielding blades from attaching to each other by static electricity produced while they are moving relative to each other.

The metallic film and oxide film for the heat-resistant, light-shielding film of the present invention are preferably made of a nickel-base material because of its high electroconductivity. More specifically, it may be pure nickel but is preferably a nickel-base alloy (composite metallic oxide) with nickel as the major ingredient which is incorporated with at least one additive element species selected from the group consisting of titanium, tantalum, tungsten, vanadium, aluminum and copper, because the above additive metal works as a dopant in a semiconductor to decrease electrical resistance. A light-shielding film with an outermost layer of insulating material, e.g., silicon oxide or alumina, has a surface resistance limited to about $10^4 \Omega/\square$. On the other hand, the heat-resistant, light-shielding film of the present invention can have a surface resistance of $1000 \Omega/\square$ or less, preferably $500 \Omega/\square$ or less, more preferably $100 \Omega/\square$ or less.

The heat-resistant, light-shielding film of the present invention may additionally include a thin film having lubricity and low friction property (e.g., fluorine-containing organic film, carbon film, diamond-like carbon film or the like) on the oxide film within limits not harmful to the characteristics of the present invention.

(D) Gas Barrier Film

A resin film base, e.g., of polyimide, generally contains large quantities of oxygen and moisture. These gases are removed by heat treatment or the like before the film is formed, but not completely. A heat-resistant, light-shielding film comprising a resin film coated with a metallic film and oxide film may release oxygen and moisture from the resin film, when exposed to a high temperature around 250° C., to allow oxygen to penetrate into part of the metallic film. The metallic film will have an optical constant changed in the affected portion to cause discoloration. A heat-resistant, light-shielding film, even when sufficiently treated to remove the gases, may be contaminated with moisture and oxygen penetrating into the resin film from the sides, when subjected to a constant-temperature, constant-humidity test carried out, e.g., at 85° C. and 90% RH for 1000 hours, the oxygen possibly penetrating into part of the metallic film to discolor the affected portion in a similar manner. The heat-resistant, light-shielding film of the present invention is preferably provided with a metal oxide film as gas barrier film by sputtering in the interface between the resin film base and metallic film to avoid the discoloration.

The gas barrier film may be of a nickel-base oxide having the same composition as that for the oxide film (C). Another effective film is a nickel-free oxide film composed of at least one element species selected from the group consisting of titanium, tantalum, tungsten, vanadium, molybdenum, cobalt, niobium, iron, aluminum and silicon as the major component(s). The gas barrier film can block the gas released from the film more efficiently, when it is oxygen-deficient off the stoichiometric composition to increase film density.

The gas barrier film is 5 to 30 nm thick, preferably 8 to 25 nm thick. The film may no longer exhibit its inherent gas barrier function when it is thinner than 5 nm. The thickness above 30 nm is also not desirable, because it may have insufficient adhesion to the metallic film. Production of the gas barrier film (D), metallic film (B) and oxide film (C) by sputtering with the same Ni-base metallic target can reduce the production cost of the heat-resistant, light-shielding film and hence is preferable, because it can be produced using the single target and cathode.

2. Method for Producing the Heat-Resistant, Light-Shielding Film

The method of the present invention for forming the heat-resistant, light-shielding film comprises steps for supplying the resin film base (A) having a surface roughness as arithmetic average height Ra of 0.2 to 0.8 μm to a sputtering unit; for sputtering the base (A) in an inert gas atmosphere to form the Ni-base metallic film (B) thereon; and for sputtering the film (B) with oxygen gas injected into the inert gas atmosphere to form the Ni-base oxide film (C) thereon.

The heat-resistant, light-shielding film of the present invention comprises the resin film base coated with the Ni-base metallic film and Ni-base oxide film having an antireflection effect in this order, both by sputtering. The Ni-base metallic film and Ni-base oxide film, which are formed by sputtering, are denser and more adhesive to the film below (the respective resin film base and Ni-base metallic film) than those produced by ink coating or vacuum deposition.

These characteristics are more noted when the heat-resistant, light-shielding film works at a high temperature environment of 200° C. Those produced by ink coating or vacuum deposition may show separation of the film or discoloration of the film resulting from oxidation. By contrast, the heat-resistant, light-shielding film of the present invention is free of the above troubles, because the coating films are produced by sputtering.

The heat-resistant, light-shielding film of the present invention is produced by coating the resin film base with the Ni-base metallic film and low-reflectivity Ni-base oxide film by sputtering, as discussed above. Sputtering is an effective procedure for forming a thin film of material having a low vapor pressure on a base or forming a film which needs precise controlling of thickness. Sputtering is generally carried out with a base as the anode and sputtering target, which provides a coating film material, as the cathode under an argon gas pressure of about 10 Pa or less, where an argon plasma is created by glow discharges between these electrodes to bombard the sputtering target as the cathode with the argon cations in the plasma, to scatter the target component particles onto the base to form the film of the particles on the base.

Sputtering is classified by how an argon plasma is produced. It is RF (Radio Frequency) sputtering when RF plasma is used, and DC (Direct Current) sputtering when a DC plasma is used. Magnetron sputtering disposes a magnet on the back side of the target to focus an argon plasma immediately above the target to secure the argon ion bombardment effect even under a low gas pressure.

The metallic film and oxide film may be formed by, for example, a reel-equipped sputtering unit illustrated in FIG. 2. It has a structure in which a rolled resin film base 1 is set on a roll 4 from which it is transferred, contents in a vacuum chamber 6 are evacuated by a vacuum pump 5, e.g., turbomolecular pump, and the film 1 transferred from the roll 4 is reeled on a reeling roll 8 after passing over a cooling can roll 7. A magnetron cathode 9 is disposed to face the cooling can roll 7, and the cathode 9 is provided with a target 10 which provides a raw material for the film. The film transfer section, comprising the rolls 4, 7 and 8, is isolated from the magnetron cathode 9 by a diaphragm 11.

As described above, the rolled resin film base 1 is first set on the roll 4 from which it is to be transferred, contents in the vacuum chamber 6 are evacuated by a vacuum pump, e.g., turbomolecular pump, and the film 1 transferred from the roll 4 is reeled on the reeling roll 8 after passing over the cooling can roll 7. While these steps are proceeding, discharges are created between the cooling can roll 7 and cathode to form the film on the resin film base 1 running in close contact with the cooling can roll surface. It is preferable that the resin film base is dried at 200° C. or higher before being subjected to sputtering.

The metallic film for the heat-resistant, light-shielding film of the present invention can be formed on the resin film base by sputtering carried out in an argon atmosphere, e.g., by DC magnetron sputtering with a metallic Ni or Ni-base alloy as the target.

Pure nickel, known as ferromagnetic, may be difficult to efficiently form the metallic film by magnetron sputtering on the resin base film by focusing a plasma, because magnetic force created by a magnet disposed on the target back side to act on a plasma between the sputtering target and base material is blocked by the nickel target material, with the result that a magnetic field leaking onto the surface may have a decreased intensity. In order to avoid these troubles, it is preferable to increase magnetic force created by the magnet disposed on the sputtering target back side, to intensify the magnetic field passing through the nickel sputtering target for producing the film.

However, it should be noted that the sputtering unit still involves another problem described below while it is working, even when the above structure is adopted. As the sputtering target of nickel loses its thickness while it is in service continuously, the leaked magnetic field in the plasma space is intensified around the thinned portion, which changes discharge characteristics and film deposition rate. In other words, deposition rate of the nickel film varies when the same nickel target is used continuously for extended periods, as it is exhausted.

The above problem can be avoided by use of a target of nickel-base alloy comprising nickel as the major ingredient incorporated with at least one additive element selected from the group consisting of titanium, tantalum, tungsten, vanadium, aluminum and copper, because such a target can reduce the ferromagnetism of nickel. In this case, the deposited film is of the metallic alloy film of the above composition. It is preferably for the present invention that the Ni-base alloy for the target is incorporated with the additive element(s) at 1 to 18% by atom. The additive element(s) can greatly reduce the ferromagnetism of nickel, when incorporated at 1% by atom or more, allowing DC magnetron sputtering even with a cathode of common magnet of weak magnetic force to form the film. At the same time, the sputtering target has a decreased magnetic field blocking capacity to reduce leaked magnetic field variation in the plasma space, which depends on exhaustion of the sputtering target, and thereby to stably deposit the film at a constant rate. The target is incorporated with the additive element(s) at 18% or less. When the target is incorporated with the element(s) at above 18% by atom, an intermetallic compound(s) may be produced massively to make the sputtering target fragile, with the result that sputtering may not be carried out satisfactorily to give the metallic alloy film of deteriorated quality, because of possible cracking of the target by thermal stresses or the like evolving in the film-making period.

Gas pressure required for forming the metallic film cannot be generalized, because it depends on sputtering unit type or the like. It is however preferably kept at 1.0 Pa or less, e.g., 0.2 to 1.0 Pa. Sputtering proceeding at the above gas pressure will prevent separation of the films from each other even in the presence of trace quantity of shot material remaining on the resin film, because of reduced differential thermal expansion between the shot material, metallic film and low-reflectivity Ni-base oxide film at a high temperature of 200° C. The gas pressure below 0.2 Pa is insufficient for forming the film, because the argon plasma loses stability to deteriorate quality of the resulting film. At above 1.0 Pa, on the other hand, the metallic film may be composed of excessive coarse particles and lose density to cause separation of the film from the resin film, because of reduced adhesion between them. Temperature of the film is preferably kept at 180° C. or higher while it is being formed. This will give the heat-resistant, light-shielding film of dense texture, with the metallic film highly adhesive to the resin film resistant to 200° C. or higher. Thickness of the metallic film is controlled by film transfer rate and power supplied to the target in the film-making period.

The resin film base is naturally heated by the plasma in the film-making period. The resin film base surface can be easily kept at 180° C. or higher by thermoelectrons flowing from the target to the film base and radiated heat from the plasma, when the gas pressure, power supplied to the target and film transfer rate are adjusted. The natural heating effect by the plasma increases as gas pressure decreases, power supplied to the target increases or film transfer rate decreases. The naturally heated resin film base surface is much hotter than the cooling can roll even when it is in contact with the cooling can roll. However, temperature of the naturally heated resin film base surface greatly depends on temperature of the cooling can roll, because it is cooled by the cooling can roll. In order to utilize the natural heating effect as far as possible in the film-making period, it is effective to increase cooling can temperature and decrease film transfer rate.

The naturally heating effect can be efficiently utilized in a floating sputtering method, in which the film is not cooled by a cooling can in the film-making period. In this method, the film base facing the target is coated with the metallic film while it is floating in the film-making chamber without being cooled on the back side. The film can be efficiently heated by being irradiated with heat from the target and plasma in the film-making chamber, which is kept under a vacuum and can efficiently accumulate the heat. The floating method can easily realize the naturally heating effect which can actually heat the film to 270° C. or higher.

Temperature of the film base surface can be determined by a radiation thermometer while it is being coated with the film. Temperature attained on the film can be also determined by a thermolabel attached to the surface by observing changed color after the film base is coated.

As described above, a resin film base of polyimide or the like contains large quantities of oxygen and moisture. Therefore, the resin film base for the present invention is preferably coated with a gas barrier film, which is also of a metal oxide, by sputtering before the metallic film. The gas barrier film may be of a nickel-base oxide having the same composition as that for the oxide film (C). Another effective film is a nickel-free oxide film composed of at least one element species selected from the group consisting of titanium, tantalum, tungsten, vanadium, molybdenum, cobalt, niobium, iron, aluminum and silicon as the major component(s).

The oxide film as the gas barrier film may be formed by DC magnetron sputtering with a sputtering target of metallic Ni or Ni-base alloy in a mixed argon/oxygen atmosphere. Gas pressure required for forming the oxide film as the gas barrier film cannot be generalized, because it depends on sputtering unit type or the like. It is however preferably kept at 1.0 Pa or less, e.g., 0.2 to 1.0 Pa. The gas pressure below 0.2 Pa is insufficient for forming the film, because the argon plasma loses stability to deteriorate quality of the resulting film. At above 1.0 Pa, on the other hand, the oxide film may be composed of excessive coarse particles and lose density to cause separation of the film from the resin film, because of reduced adhesion between them. Temperature of the film is preferably kept at 180° C. or higher while it is being formed. This will give the heat-resistant, light-shielding film of dense texture, with the oxide film highly adhesive to the resin film. Thickness of the oxide film is controlled by film transfer rate and power supplied to the target in the film-making period. The gas barrier film can work efficiently when it is 5 to 30 nm thick.

The resin film base (A) is coated with the gas barrier film (D), as required, metallic film (B) and Ni-base oxide film (C) in this order. The low-reflectivity oxide film may be formed by DC magnetron sputtering with a sputtering target of metallic Ni or Ni-base alloy in a mixed argon/oxygen gas atmosphere. Gas pressure required for forming the oxide film cannot be generalized, because it depends on sputtering unit type or the like. It is however preferably kept at 1.0 Pa or less, e.g., 0.2 to 1.0 Pa. The gas pressure below 0.2 Pa is insufficient for forming the film, because the argon plasma loses stability to deteriorate quality of the resulting film. At above 1.0 Pa, on the other hand, the oxide film may be composed of excessive coarse particles and lose density to cause separation of the film from the resin film, because of reduced adhesion between them. Temperature of the film is preferably kept at 180° C. or higher while it is being formed. This will give the heat-resistant, light-shielding film with dense texture oxide film. Thickness of the oxide film is controlled by film transfer rate and power supplied to the target in the film-making period.

The film-making step for forming the oxide film can be also carried out directly with the same sputtering target as that used for the metallic film, by which is meant that the sputtering steps can be carried out continuously without changing the target to decrease the production cost. Moreover, these films can be disposed center-symmetrically on the resin film base to prevent deformation of the resin film base by stresses formed in these films to improve productivity.

Thus, the heat-resistant, light-shielding film coated with the metallic film and oxide film on one side is produced. When the heat-resistant, light-shielding film is to be coated with these films on both sides, the back side is coated with the metallic film and oxide film in this order in a similar manner.

Formation of the metallic film and oxide film is described in detail taking a continuous process as an example by a reel-equipped sputtering unit. However, the method for forming these films is not limited to the above. For example, these films may be formed batchwise, where the base film is kept immobilized in the film-making period. In this case, however, additional steps for changing the atmosphere gas and starting/stopping the film transfer, making the film-making process time-consuming. The base film may not be rolled. For example, it may be fixed in a sputtering unit after being cut into a given size.

3. Applicable Areas for the Heat-Resistant, Light-Shielding Film

The heat-resistant, light-shielding film of the present invention can find use in aperture materials and for light intensity adjusting devices.

The heat-resistant, light-shielding film may be punched to produce fixing apertures, shutter blades or aperture blades for digital cameras or digital video cameras, or for aperture blades for adjusting light intensity for liquid-crystal projectors, because punching will rarely cause cracking around the edges. FIG. 3 schematically illustrates a stopping-down mechanism of aperture device which includes a blade of heat-resistant, light-shielding film 12 produced by punching. The heat-resistant, light-shielding film blade 12 is provided with guide holes 13, a guide pin 14 connected to a driving motor and hole 17 by which the blade is set on a base board 16 provided with a pin 15 for controlling a position at which the blade works. The base board 16 is provided with an opening 18 at the center, through which light from a lamp is passed. The light-shielding blade can take a varying shape depending on the aperture device structure. Moreover, the blade of the heat-resistant, light-shielding film of the present invention with a resin film as the base can have a reduced weight, and hence reduce size of a driver for driving the blade and also reduce power consumed by the driver.

EXAMPLES

Next, the present invention is described more specifically by Examples and Comparative Examples. The heat-resistant, light-shielding film prepared was evaluated by the following procedures.

(Optical Density and Reflectivity)

Light-shielding capacity and reflectivity were determined by a spectrophotometer for the visible light in a wavelength range from 380 to 780 nm. The light-shielding capacity was determined by the following equation:

Optical density=$\log(1/T)$ where T is transmittance determined by a spectrophotometer.

The heat-resistant, light-shielding film should have an optical density of 4 or more to completely shield the visible light in a wavelength range from 380 to 780 nm.

(Surface Gloss)

Surface gloss was determined by a gloss meter in accordance with JIS Z8741. The film is considered to have a good surface gloss when it is below 5%.

(Friction Coefficient)

Static and dynamic friction coefficients were determined in accordance with JIS D1894. The heat-resistant, light-shielding film was rated "good (o)" with respect to friction coefficient when its static and dynamic coefficients were 0.3 or less and "bad (x)" when they were above 0.3.

(Surface Roughness)

Arithmetic average height Ra of the heat-resistant, light-shielding film was determined by a surface roughness meter.

(Heat Resistance)

The prepared heat-resistant, light-shielding film was evaluated for its heat resistant characteristic by the following procedure. The film sample was left in an oven (Advantech) set at 220° C. for 24 hours. It was rated "good (o)" when it showed no deformation or discoloration after it was withdrawn from the oven, and "bad (x)" when it showed deformation or discoloration.

(Adhesion)

Adhesion of the heat-resistant, light-shielding film was evaluated in accordance with JIS C0021, after it was subjected to the heat resistance test. It was rated "good (o)" when it showed no separation, and "bad (x)" when it showed separation.

(Electroconductivity)

Surface electrical resistance of the heat-resistant, light-shielding film was measured in accordance with JIS K6911.

Example 1

The metallic light-shielding film and metal oxide film were formed by a reel-equipped sputtering unit illustrated in FIG. 2. First, a target 10 was set on a magnetron cathode 9 facing a cooling can roll 7 in the sputtering unit, where the target 10 provided a film material. A film transfer section, comprising a roll 4 from which the rolled film was transferred, cooling can roll 7 and roll 8 on which the film was reeled, was isolated from the magnetron cathode 9 by a diaphragm 11. Next, a rolled resin film base 1 of polyimide (PI) was set on the roll 4. It was surface-treated by sand blasting under controlled discharge timing, discharge pressure and transfer rate to have the surface of fine irregular structure with an arithmetic average height Ra of 0.5 μm on each side. The polyimide (PI) film was dried at 200° C. or higher before it was treated by sputtering.

Next, contents in a vacuum chamber 6 were evacuated by a vacuum pump, e.g., turbomolecular pump, and discharges were created between the cooling can roll 7 and cathode to form the film on the resin film base 1 running in close contact with the cooling can roll surface. First, Ni-base alloy target containing Ni as the major ingredient and W at 6.9% by atom was set on the cathode, with which the metallic film was formed by DC sputtering carried out in a high-purity (99.999%) argon gas atmosphere. Thickness of the metallic film was controlled by film transfer rate and power supplied to the target in the film-making period. The resin film base 1 transferred from the roll 4 was reeled on the roll 8 after it passed over the cooling can roll 7.

Next, the resin film base coated with the metallic film was set on the roll and supplied to the sputtering unit with the Ni-base alloy target left unchanged, to form a low-reflectivity metal oxide film on the metallic film by DC sputtering with the same target in a mixed sputtering gas of argon incorporated with oxygen gas at 2%. The oxide film, 300 nm thick, formed on the transparent base under the above conditions was confirmed to massively contain oxygen deficiencies, because it had a low transmittance of 30 to 50% in the visible region, as revealed by evaluation of its optical properties. Thickness of the oxide film was controlled by film transfer rate and power supplied to the target in the film-making period. The coated resin film base 1 transferred from the roll 4 was reeled on the roll 8 after it passed over the cooling can roll 7. This produced the resin film base coated with a 100 nm thick metallic film and 50 nm thick oxide film on one side.

Temperature of the film surface was observed by an infrared radiation thermometer through an inspection window of quartz glass in the reel-equipped sputtering unit while the metallic film and oxide film were being sputtering-treated. It was 180 to 220° C. Each of the metallic film and oxide film formed was found to have a composition substantially the same as that of the target, as confirmed by ICP emission analysis and quantitative analysis by EPMA.

Then, the coated film was reeled on another roll, with the coated surface inside, and the sputtering procedure was repeated to coat the uncoated side. This produced the heat-resistant, light-shielding film comprising the 75 μm thick resin film base coated with the 100 nm thick metallic film and 50 nm thick oxide film on each side. It had the metallic film and oxide film center-symmetrically deposited on the polyimide (PI) film base by forming them on one side and then on the other side separately.

The heat-resistant, light-shielding film thus produced was evaluated by the procedures described above. It had an optical density of 4 or more and maximum reflectivity of 1%. It had a sufficiently low surface gloss, having a surface gloss of 3% or less. It was rated "good" with respect to friction coefficient, because both static and dynamic friction coefficients were 0.3 or less. It had a surface resistance of 100Ω/☐ or less and arithmetic average surface height of 0.4 μm. It was also rated "good" with respect to heat resistance, because heat-resistant, light-shielding film showed no deformation, discoloration or separation of the film after it was heat-treated. It also had a hardness of H or more representing a sufficient hardness, as confirmed by the scratch test carried out in accordance with JIS K5600-5-4 (Pencil method). It showed no changes in light-shielding capacity, reflection characteristic, surface gloss and friction coefficient before and after the heat treatment. The structure and characteristics of the heat-resistant, light-shielding film prepared are summarized in Table 1.

The heat-resistant, light-shielding film prepared was rated "good" with respect to all of optical density, reflectivity, surface gloss, heat resistance, friction coefficient and electroconductivity. It is thus found that the heat-resistant, light-shielding film can be useful for apertures and so forth in liquid-crystal projectors working at a high temperature atmosphere of around 200° C.

Example 2

A heat-resistant, light-shielding film was prepared under the same conditions as in Example 1, except that thickness of the metallic film was changed to 50 nm.

The heat-resistant, light-shielding film prepared was evaluated for optical characteristics and heat resistance in a manner and under conditions similar to those for Example 1. Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

It was found to have characteristics equivalent to those observed in Example 1 with respect to optical density, reflectivity, surface gloss and so forth. It was confirmed to have a surface resistance of 120Ω/☐ and arithmetic average surface height Ra of 0.4 μm. It was also found to have heat resistance characteristics equivalent to those observed in Example 1, as observed in the adhesion test after it was subjected to the heat treatment test carried out at 220° C. for 24 hours, because it showed no deformation or separation of the film, and also to have good friction coefficients. The structure and characteristics of the heat-resistant, light-shielding film prepared are summarized in Table 1.

It is thus found that the heat-resistant, light-shielding film can be useful for apertures and so forth in liquid-crystal projectors working at a high temperature atmosphere of around 200° C.

Example 3

A heat-resistant, light-shielding film was prepared under the same conditions as in Example 1, except that thickness of the metallic film was changed to 150 nm.

The heat-resistant, light-shielding film prepared was evaluated for optical characteristics and heat resistance in a manner and under conditions similar to those for Example 1. Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

It was found to have characteristics equivalent to those observed in Example 1 with respect to optical density, reflectivity, surface gloss and so forth. It was confirmed to have a surface resistance of 90Ω/☐ and arithmetic average surface height Ra of 0.3 μm. It was also found to have heat resistance characteristics equivalent to those observed in Example 1, as observed in the adhesion test after it was subjected to the heat treatment test carried out at 220° C. for 24 hours, because it showed no deformation or separation of the film, and also to have good friction coefficients. The structure and characteristics of the heat-resistant, light-shielding film prepared are summarized in Table 1.

It is thus found that the heat-resistant, light-shielding film can be useful for apertures and so forth in liquid-crystal projectors working at a high temperature atmosphere of around 200° C.

Example 4

A heat-resistant, light-shielding film was prepared under the same conditions as in Example 1, except that the polyimide film was surface-treated by sand blasting under different conditions to have an arithmetic average height Ra of 0.2 μm. The polyimide was the same as that used in Example 1 in type and thickness.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1. The heat-resistant, light-shielding film prepared was evaluated for optical characteristics and heat resistance in a manner and under conditions similar to those for Example 1.

It was found to have characteristics equivalent to those observed in Example 1 with respect to optical density, reflectivity, surface gloss and so forth. It was confirmed to have a surface resistance of 100Ω/☐ and arithmetic average surface height Ra of 0.1 μm. It was also found to have heat resistance characteristics equivalent to those observed in Example 1, as observed in the adhesion test after it was subjected to the heat treatment test carried out at 220° C. for 24 hours, because it showed no deformation or separation of the film, and also to have good friction coefficients.

It is thus found that the heat-resistant, light-shielding film can be useful for apertures and so forth in liquid-crystal projectors working at a high temperature atmosphere of around 200° C.

Example 5

A heat-resistant, light-shielding film was prepared under the same conditions as in Example 1, except that the polyimide film was surface-treated by sand blasting under different conditions to have an arithmetic average height Ra of 0.8 μm. The polyimide was the same as that used in Example 1 in type and thickness.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found to have characteristics equivalent to those observed in Example 1 with respect to optical density, reflectivity, surface gloss and so forth. It was confirmed to have a surface resistance of 100Ω/□ and arithmetic average surface height Ra of 0.7 μm. It was also found to have heat resistance characteristics equivalent to those observed in Example 1, as observed in the adhesion test after it was subjected to the heat treatment test carried out at 220° C. for 24 hours, because it showed no deformation or separation of the film, and also to have good friction coefficients. The structure and characteristics of the heat-resistant, light-shielding film prepared are summarized in Table 1.

It is thus found that the heat-resistant, light-shielding film can be useful for apertures and so forth in liquid-crystal projectors working at a high temperature atmosphere of around 200° C.

Example 6

A heat-resistant, light-shielding film was prepared under the same conditions as in Example 1, except that the metallic light-shielding film and low-reflectivity oxide film were formed on one side of the resin film base instead of on both sides.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found to have characteristics equivalent to those observed in Example 1 with respect to optical density, reflectivity, surface gloss and so forth. It was confirmed to have a surface resistance of 100Ω/□ and arithmetic average surface height Ra of 0.4 μm. It was also found to have heat resistance characteristics equivalent to those observed in Example 1, as observed in the adhesion test after it was subjected to the heat treatment test carried out at 220° C. for 24 hours, because it showed no separation of the film, and also to have good friction coefficients.

Deformation of the film was observed to some extent during the heat treatment test; 2 mm at the largest on the 5 cm square sample placed on a flat plane, caused by a stress evolving in the sample coated on only one side. The film showing a deformation of the above magnitude can be used for an aperture, when bonded to and fixed on the film base at several points. The structure and characteristics of the heat-resistant, light-shielding film prepared are summarized in Table 1.

It is thus found that the heat-resistant, light-shielding film can be useful for apertures and so forth in liquid-crystal projectors working at a high temperature atmosphere of around 200° C.

Example 7

A heat-resistant, light-shielding film was prepared in a manner similar to that for Examples 1 to 6, except that the Ni-base alloy target contained W at 5% by atom. The oxide film formed on the metallic film was a low-reflectivity film having a transmittance of 20 to 50% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

It was thus found that the light-shielding film prepared had optical characteristics and heat resistance equivalent to those of the films prepared in Examples 1 to 6. It also had good friction coefficients. Moreover, it was confirmed to have a surface resistance of 120Ω/□ and arithmetic average surface height Ra of 0.4 μm. The similar results were observed with a heat-resistant, light-shielding film prepared by sputtering with Ni-base alloy target containing W at 14% by atom.

It is thus found that the heat-resistant, light-shielding film can be useful for apertures and so forth in liquid-crystal projectors working at a high temperature atmosphere of around 200° C.

Example 8

A heat-resistant, light-shielding film was prepared under conditions and in format similar to those for Examples 1 to 5, except that the Ni-base alloy target contained Ni as the major ingredient and Ti at 9.0% by atom. The oxide film formed on the metallic film was a low-reflectivity film having a transmittance of 25 to 43% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found that to have characteristics equivalent to those observed in Example 1 with respect to optical density, reflectivity, surface gloss and so forth, and also to have good friction coefficients. Moreover, it had a surface resistance of 100Ω/□ and arithmetic average surface height Ra of 0.3 μm. It was also confirmed to have heat resistance characteristics equivalent to those observed in Example 1, as observed in the adhesion test after it was subjected to the heat treatment test carried out at 220° C. for 24 hours, because it showed no deformation or separation of the film, and also to have good friction coefficients.

It is thus found that the heat-resistant, light-shielding film can be useful for apertures and so forth in liquid-crystal projectors working at a high temperature atmosphere of around 200° C.

Example 9

A heat-resistant, light-shielding film was prepared in a manner similar to that for Examples 8, except that the Ni-base alloy target contained Ti at 6% by atom. The oxide film formed on the metallic film was a low-reflectivity film having a transmittance of 25 to 55% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

It was found to have optical characteristics and heat resistance equivalent to those of the films prepared in Examples 1 to 6, and to have a surface resistance of 100Ω/□ and arithmetic average surface height Ra of 0.3 μm. It also had good friction coefficients. The similar results were observed with a heat-resistant, light-shielding film prepared by sputtering with Ni-base alloy target containing Ti at 18% by atom.

It is thus found that the heat-resistant, light-shielding film can be useful for apertures and so forth in liquid-crystal projectors working at a high temperature atmosphere of around 200° C.

Example 10

A heat-resistant, light-shielding film was prepared under conditions and in format similar to those for Examples 1 to 5, except that the Ni-base alloy target contained Ni as the major ingredient and Ta at 2.3% by atom. The oxide film formed on the metallic film was a low-reflectivity film having a transmittance of 23 to 40% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found to have characteristics equivalent to those observed in Example 1 with respect to optical density, reflectivity, surface gloss and so forth. It also had good friction coefficients. It was confirmed to have a surface resistance of 400Ω/□ and arithmetic average surface height Ra of 0.3 μm. It was also found to have heat resistance characteristics equivalent to those observed in Example 1, as observed in the adhesion test after it was subjected to the heat treatment test carried out at 220° C. for 24 hours, because it showed no deformation or separation of the film.

It is thus found that the heat-resistant, light-shielding film can be useful for apertures and so forth in liquid-crystal projectors working at a high temperature atmosphere of around 200° C.

Example 11

A heat-resistant, light-shielding film was prepared in a manner similar to that for Examples 8, except that the Ni-base alloy target contained Ta at 1% by atom. The oxide film formed on the metallic film was a low-reflectivity film having a transmittance of 18 to 54% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

It was found that the light-shielding film prepared had optical characteristics and heat resistance equivalent to those of the films prepared in Examples 1 to 6, and a surface resistance of 400Ω/□ and arithmetic average surface height Ra of 0.3 μm. It also had good friction coefficients. The similar results were observed with a heat-resistant, light-shielding film prepared by sputtering with an Ni-base alloy target containing Ta at 5% by atom.

It is thus found that the heat-resistant, light-shielding film can be useful for apertures and so forth in liquid-crystal projectors working at a high temperature atmosphere of around 200° C.

Example 12

A heat-resistant, light-shielding film was prepared under conditions and in format similar to those for Examples 1 to 5, except that the Ni-base alloy target contained Ni as the major ingredient and V at 7.9% by atom. The oxide film formed on the metallic film was a low-reflectivity film having a transmittance of 35 to 65% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found to have characteristics equivalent to those observed in Example 1 with respect to optical density, reflectivity, surface gloss and so forth. It was confirmed to have a surface resistance of 500Ω/□ and arithmetic average surface height Ra of 0.4 μm. It also had good friction coefficients. It was also confirmed to have heat resistance characteristics equivalent to those observed in Example 1, as observed in the adhesion test after it was subjected to the heat treatment test carried out at 220° C. for 24 hours, because it showed no deformation or separation of the film.

It is thus found that the heat-resistant, light-shielding film can be useful for apertures and so forth in liquid-crystal projectors working at a high temperature atmosphere of around 200° C.

Example 13

A heat-resistant, light-shielding film was prepared in a manner similar to that for Examples 8, except that the Ni-base alloy target contained V at 6% by atom. The oxide film formed on the metallic film was a low-reflectivity film having a transmittance of 33 to 56% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

It was found to have optical characteristics and heat resistance equivalent to those of the films prepared in Examples 1 to 6, and a surface resistance of 500Ω/□ and arithmetic average surface height Ra of 0.4 µm. It also had good friction coefficients. The similar results were observed with a heat-resistant, light-shielding film prepared by sputtering with Ni-base alloy target containing V at 18% by atom.

It is thus found that the heat-resistant, light-shielding film can be useful for apertures and so forth in liquid-crystal projectors working at a high temperature atmosphere of around 200° C.

Example 14

A heat-resistant, light-shielding film was prepared under conditions and in format similar to those for Examples 1 to 5, except that the Ni-base alloy target contained Ni as the major ingredient and Al at 9.1% by atom. The oxide film formed on the metallic film was a low-reflectivity film having a transmittance of 36 to 56% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found to have characteristics equivalent to those observed in Example 1 with respect to optical density, reflectivity, surface gloss and so forth. It was confirmed to have a surface resistance of 80Ω/□ and arithmetic average surface height Ra of 0.3 µm. It also had good friction coefficients. It was also confirmed to have heat resistance characteristics equivalent to those observed in Example 1, as observed in the adhesion test after it was subjected to the heat treatment test carried out at 220° C. for 24 hours, because it showed no deformation or separation of the film.

It is thus found that the heat-resistant, light-shielding film can be useful for apertures and so forth in liquid-crystal projectors working at a high temperature atmosphere of around 200° C.

Example 15

A heat-resistant, light-shielding film was prepared in a manner similar to that for Examples 8, except that the Ni-base alloy target contained Al at 6% by atom. The oxide film formed on the metallic film was a low-reflectivity film having a transmittance of 25 to 54% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

It was found to have optical characteristics and heat resistance equivalent to those of the films prepared in Examples 1 to 6, and a surface resistance of 80Ω/□ and arithmetic average surface height Ra of 0.3 µm. It also had good friction coefficients. The similar results were observed with a heat-resistant, light-shielding film prepared by sputtering with Ni-base alloy target containing Al at 16% by atom.

It is thus found that the heat-resistant, light-shielding film can be useful for apertures and so forth in liquid-crystal projectors working at a high temperature atmosphere of around 200° C.

Example 16

A heat-resistant, light-shielding film was prepared under conditions and in format similar to those for Example 1, except that the Ni-base alloy target contained Ni as the major ingredient and W at 6.9% by atom and gas pressure was set at 0.2 Pa in the film-making period. The oxide film formed on the metallic film was a low-reflectivity film having a transmittance of 17 to 44% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated in a manner and under conditions similar to those for Example 1. It was found to have characteristics equivalent to those observed in Example 1 with respect to optical density, reflectivity, surface gloss and so forth. It had good friction coefficients. It was confirmed to have a surface resistance of 100Ω/□ and arithmetic average surface height Ra of 0.3 µm. The similar results were observed with heat-resistant, light-shielding films prepared at a gas pressure of 0.5, 0.7 or 1.0 Pa.

It is thus found that the heat-resistant, light-shielding film can be useful for apertures and so forth in liquid-crystal projectors working at a high temperature atmosphere of around 200° C.

Example 17

A heat-resistant, light-shielding film was prepared under the same conditions as in Example 1, except that thickness of the polyimide film was changed to 12.5 µm.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found to have characteristics equivalent to those observed in Example 1 with respect to reflectivity, surface gloss and so forth. It had an optical density of 4 or more, maximum reflectivity of 1%, surface gloss of 3% or less, surface resistance of 100Ω/□ and arithmetic average surface height Ra of 0.4 μm. It was also found to have heat resistance characteristics equivalent to those observed in Example 1, as observed in the adhesion test after it was subjected to the heat treatment test carried out at 220° C. for 24 hours, because it showed no deformation or separation of the film.

It was good with respect to all of optical density, reflectivity, surface gloss, heat resistance, friction coefficients and electroconductivity. It is thus found that the heat-resistant, light-shielding film can be useful for apertures and so forth in liquid-crystal projectors working at a high temperature atmosphere of around 200° C.

A heat-resistant, light-shielding film had equivalent characteristics, when thickness of the polyimide film was changed to 25 and 38 μm.

Example 18

A heat-resistant, light-shielding film was prepared under the same conditions as in Example 1, except that the metallic film and low-resistivity oxide film were formed with a pure Ni target. The oxide film formed on the metallic film was a low-reflectivity film having a transmittance of 20 to 50% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found to have characteristics equivalent to those observed in Example 1 with respect to optical density, reflectivity, surface gloss and so forth. It also had good friction coefficients. It was also confirmed that it had a surface resistance of 900Ω/□ and arithmetic average surface height Ra of 0.3 μm. It showed no deformation, when evaluated by the adhesion test after it was subjected to the heat treatment test carried out at 220° C. for 24 hours, although showing film separation slightly. The metallic film was found to separate from the polyimide film in the interface between them, as observed by scanning electron microscopic analysis of the separated portion. It is thus found that a light-shielding film may not always have high heat resistance and adhesion, when the metallic film is of Ni and low resistance oxide film is of NiO. The structure and characteristics of the heat-resistant, light-shielding film prepared are summarized in Table 1.

It is thus found that the heat-resistant, light-shielding film is unsuitable for apertures and so forth in liquid-crystal projectors working at a high temperature atmosphere of around 200° C., although useful for many optical devices working at normal temperature.

Example 19

A heat-resistant, light-shielding film was prepared under conditions and in format similar to those for Example 1, except that the Ni-base alloy target contained Ni as the major ingredient and W at 6.9% by atom, sputtering gas was kept at 1.2 Pa and incorporated with oxygen at 0.5% while the oxide film was being formed. The oxide film formed on the metallic film was a low-reflectivity film having a transmittance of 26 to 45% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated in a manner and under conditions similar to those for Example 1. It was found that to have characteristics equivalent to those observed in Example 1 with respect to optical density, reflectivity and surface gloss. It also had good friction coefficients, and a surface resistance of 100Ω/□ and arithmetic average surface height Ra of 0.3 μm. However, it showed film separation slightly, as observed by in the adhesion test carried out after the heat resistance test.

It is thus found that the heat-resistant, light-shielding film is unsuitable for apertures and so forth in liquid-crystal projectors working at a high temperature atmosphere of around 200° C., although useful for many optical devices working at normal temperature.

Example 20

A heat-resistant, light-shielding film was prepared under the same conditions as in Example 1, except that thickness of the polyimide film was changed to 50 nm, and the metallic film and oxide film were formed with an Ni-base alloy target containing Cu at 5% by atom. The oxide film formed on the metallic film was a low-reflectivity film having a transmittance of 23 to 50% by itself in the visible region at a thickness of 300 nm, indicating that it massively contained oxygen deficiencies.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found to have characteristics equivalent to those observed in Example 1 with respect to optical density, reflectivity, surface gloss and so forth. It also had good friction coefficients. It had an optical density of 4 or more, maximum reflectivity of 1%, surface gloss of 3% or less. It was confirmed to have a surface resistance of 100Ω/□ and arithmetic average surface height Ra of 0.4 μm. It was also confirmed to have heat resistance characteristics equivalent to those observed in Example 1, as observed in the adhesion test after it was subjected to the heat treatment test carried out at 220° C. for 24 hours, because it showed no deformation or separation of the film.

It was good with respect to all of optical density, reflectivity, surface gloss, heat resistance, friction coefficients and electroconductivity. It is thus found that the heat-resistant, light-shielding film can be useful for apertures and so forth in liquid-crystal projectors working at a high temperature atmosphere of around 200° C.

Example 21

A heat-resistant, light-shielding film was prepared under the same conditions as in Example 1, except that thickness of the polyimide film was changed to 125 nm, thickness of the metallic film was changed to 250 nm and thickness of the metal oxide film was changed to 240 nm.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found to have characteristics equivalent to those observed in Example 1 with respect to reflectivity, surface gloss and so forth. It also had good friction coefficients. It had an optical density of 4 or more, maximum reflectivity of 1%, surface gloss of 3% or less. It was confirmed to have a surface resistance of 100Ω/□ and arithmetic average surface height Ra of 0.4 μm. It was also found to have heat resistance characteristics equivalent to those observed in Example 1, as observed in the adhesion test after it was subjected to the heat treatment test carried out at 220° C. for 24 hours, because it showed no deformation or separation of the film.

It was good with respect to all of optical density, reflectivity, surface gloss, heat resistance, friction coefficients and electroconductivity. It is thus found that the heat-resistant, light-shielding film can be useful for apertures and so forth in liquid-crystal projectors working at a high temperature atmosphere of around 200° C.

Comparative Example 1

A heat-resistant, light-shielding film was prepared under the same conditions as in Example 2, except that the polyimide film was surface-treated by sand blasting under different conditions to have an arithmetic average surface height Ra of 0.1 μm. The polyimide was the same as that used in Example 2 in type and thickness.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found that it had an optical density of 4 or more, equivalent to that prepared in Example 2. However, it had a higher reflectivity of 15% as a maximum reflectivity and surface gloss of 25% than that prepared in Example 2. It had good friction coefficients. It was confirmed to have a surface resistance of 120Ω/□ and arithmetic average surface height Ra of 0.03 μm. It showed no deformation or separation of the film, as observed in the adhesion test after it was subjected to the heat treatment test carried out at 220° C. for 24 hours. The structure and characteristics of the heat-resistant, light-shielding film prepared are summarized in Table 1.

The heat-resistant, light-shielding film having a high reflectivity and surface gloss cannot be used for shutter blades or the like, because they would be adversely affected by surface reflection.

Comparative Example 2

A heat-resistant, light-shielding film was prepared under the same conditions as in Example 2, except that the polyimide film was surface-treated by sand blasting under different conditions to have an arithmetic average surface height Ra of 1.0 μm. The polyimide was the same as that used in Example 2 in type and thickness.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It had a reflectivity of 1% or less and surface gloss of 3% or less, equivalent to those observed in Example 2, but an optical density of 2, lower than that observed in Example 2. It had good friction coefficients. It was confirmed to have a surface resistance of 120Ω/□ and arithmetic average surface height Ra of 0.9 μm. It showed no deformation or separation of the film, as observed in the adhesion test after it was subjected to the heat treatment test carried out at 220° C. for 24 hours. The structure and characteristics of the heat-resistant, light-shielding film prepared are summarized in Table 1.

The heat-resistant, light-shielding film cannot be used for many optical devices, including aperture members in liquid-crystal projectors, because it transmits fairly more light than those prepared in Examples.

Comparative Example 3

A heat-resistant, light-shielding film was prepared under conditions and in format similar to those for Example 1, except that the polyimide film was replaced by a 75 μm thick PET film. Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

It was confirmed to have an optical density of 3, reflectivity of 2% or more, surface gloss of 5%, surface resistance of 150Ω/□ and arithmetic average surface height Ra of 0.5 μm. Its friction coefficients were bad. It is found that the heat-resistant, light-shielding film is unsuitable for blade members, e.g., apertures, in liquid-crystal projectors working at a high temperature atmosphere of around 200° C., because of its excessive surface swelling and wrinkling.

The similar results were observed with heat-resistant, light-shielding films in which PEN or PC film was used.

Comparative Example 4

A heat-resistant, light-shielding film was prepared in a manner similar to that for Example 1, except that the resin film base was coated only with the metallic film, i.e., no oxide film was formed. Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C.

The heat-resistant, light-shielding film prepared had an arithmetic average surface height Ra of 0.4 µm, optical density of 4 or more and surface resistance of 100Ω/□, thus exhibiting a sufficient light-shielding capacity and electroconductivity. However, it had a high maximum reflectivity of 11% and surface gloss of 15%, resulting from the metallic film of high reflectivity. The heat-resistant, light-shielding film is unsuitable for optical members in lens units, because reflected light would create stray light.

It had a hardness of the level of HB, as observed by the scratch test carried out in accordance with JIS K5600-5-4 (Pencil method). Thus, it was inferior to any heat-resistant, light-shielding film prepared in each of Examples, which showed a hardness of H or more. Because it had the metallic film as the outermost film whereas the one prepared in each of Examples had the oxide film having a high hardness as the outermost layer. When it is used for blades in light intensity adjusting devices or shutters, the blades would be damages as they scrape each other, to cause gradual deterioration of its light-shielding capacity.

It had the films notably separated from each other, as observed in the adhesion test after it was subjected to the heat treatment test carried out at 220° C. for 24 hours. The heat-resistant, light-shielding film with the separated films had an optical density of 3 and insufficient friction coefficients.

The heat-resistant, light-shielding film cannot be used for light-shielding members working on the lens unit side. It is also unsuitable for blade members, e.g., apertures, in liquid-crystal projectors working at a high temperature atmosphere of around 200° C., because of its insufficient heat resistance.

Comparative Example 5

A heat-resistant, light-shielding film was prepared under the same conditions as in Example 1, except that thickness of the metallic film was changed to 30 nm.

Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., representing an equivalent temperature to those observed in Example 1.

The heat-resistant, light-shielding film prepared was evaluated for optical characteristics and heat resistance in a manner and under conditions similar to those for Example 1. It was found that to have characteristics equivalent to those observed in Example 1 with respect to reflectivity and surface gloss and so forth. It was confirmed that it could transmit light slightly, because of its optical density of 2. It had friction coefficients equivalent to those observed in Example 1. It was also confirmed that it had a surface resistance of 100Ω/□ and arithmetic average surface height Ra of 0.4 µm. It was also found that it had heat resistance characteristics equivalent to those observed in Example 1, because it showed no deformation or separation of the film, as observed in the adhesion test after it was subjected to the heat treatment test carried out at 220° C. for 24 hours. The structure and characteristics of the heat-resistant, light-shielding film prepared are summarized in Table 1.

The heat-resistant, light-shielding film cannot be used for aperture members in digital cameras and liquid-crystal projectors, because it transmits light slightly.

Example 22

A heat-resistant, light-shielding film was prepared in a manner similar to that for Example 1, except that the resin film was coated with a gas barrier layer before the metallic film, thickness of the metallic film was changed to 130 nm, thickness of the metal oxide film as the outermost film was changed to 65 nm, and thickness of the resin film was changed to 125 µm thick, although it was of the same polyimide type and had the same surface roughness. The gas barrier film was of the same Ni-base oxide as that for the metal oxide film formed on the metallic film, and was 20 nm thick. More specifically, the gas barrier film, metallic film and metal oxide film were formed with the same nickel-base alloy target, wherein the gas barrier film and metal oxide film as the outermost film were formed by reactive sputtering in a sputtering gas incorporated with oxygen, whereas the light-shielding metallic film was formed in a sputtering gas of only argon gas.

Temperature of the film surface was observed by an infrared radiation thermometer through an inspection window of quartz glass in the reel-equipped sputtering unit while the gas barrier film, metallic film and oxide film were being sputtering-treated in the same manner as in Example 1. It was 180 to 220° C., representing an equivalent temperature to those observed in Example 1.

The heat-resistant, light-shielding film prepared was evaluated in a manner similar to that used in Example 1. It was found that to have an optical density of 4 or more, maximum and minimum reflectivities of respective 2 and 1.5% in a wavelength range from 380 to 780 nm, and surface gloss of 3% or less. It was also evaluated for its heat resistance by the test carried out in a similar manner, which produced the same result. It was confirmed to have a surface resistance of 5Ω/□ and arithmetic average surface height Ra of 0.4 µm.

It is thus found that the heat-resistant, light-shielding film can be useful for apertures and so forth in liquid-crystal projectors working at a high temperature atmosphere of around 200° C.

At the same time, the heat-resistant, light-shielding film prepared was subjected to a constant-temperature, constant-humidity test carried out at 85° C. and 90% RH for 1000 hours. It had an optical density, maximum and minimum reflectivities, color, and surface resistance remaining unchanged before and after the test.

Example 23

A heat-resistant, light-shielding film was prepared in a manner similar to that for Example 22, except that thickness of the gas barrier film was changed to 5 nm. It was subjected to a constant-temperature, constant-humidity test carried out in a manner similar to that for Example 22 at 85° C. and 90% RH for 1000 hours. It had an optical density, maximum and minimum reflectivities, color, and surface resistivity remaining completely unchanged before and after the test. The similar results were observed when thickness of the gas barrier was changed to 10 and 30 nm.

Example 24

A heat-resistant, light-shielding film was prepared in a manner and format similar to those for Example 22, except that the gas barrier was not formed. Temperature of the film surface was observed in a manner similar to that for Example 1 while metallic film and oxide film were being sputtering-treated. It was 180 to 220° C.

The heat-resistant, light-shielding film prepared was evaluated in a manner similar to that used in Example 1. It was found to have an optical density of 4 or more, maximum and minimum reflectivities of respective 2 and 1.5% in a wavelength range from 380 to 780 nm, and surface gloss of 3% or less. It was also evaluated for its heat resistance by the test carried out in a similar manner, which produced the same result as in Example 1. It was confirmed to have a surface resistance of 5Ω/□ and arithmetic average surface height Ra of 0.4 μm.

It is thus found that the heat-resistant, light-shielding film can be useful for apertures and so forth in liquid-crystal projectors working at a high temperature atmosphere of around 200° C.

The heat-resistant, light-shielding film was subjected to a constant-temperature, constant-humidity test carried out at 85° C. and 90% RH for 1000 hours. It showed no change in optical density, but changed in color slightly from black to dark navy blue. It had a maximum reflectivity increased to 5% and minimum reflectivity decreased to 0.2%, as observed by spectroscopy carried out in a wavelength range from 380 to 780 nm, indicating expanded dependence of reflectivity on wavelength. It was found that oxygen penetrated into some portions (10 to 20 nm deep) of the metallic layer on the resin film side to a concentration of 3 to 8%, as observed by a TEM on the tested sample cross-section and local compositional analysis by EDX. It was considered that the changed reflectivity resulted from the double structure of the metallic film, which changed optical characteristics of the affected portions.

The heat-resistant, light-shielding film had a maximum reflectivity kept at 5% or less in spite of the changed color, and is still sufficiently useful. It is however effective to form a gas barrier film, as in Examples 22 and 23, for purposes which require unchanged color.

Example 25

A heat-resistant, light-shielding film was prepared in a manner similar to that for Example 23, except that the gas barrier film of nickel-base oxide was replaced by a 30 nm thick silicon oxide film formed by sputtering. It was subjected to a constant-temperature, constant-humidity test carried out at 85° C. and 90% RH for 1000 hours. It remained unchanged in color and reflectivity, demonstrating effectiveness of its gas barrier film.

The similar results were observed with heat-resistant, light-shielding films prepared in the same manner, except the gas barrier film was replaced by each of a 10 nm thick tantalum oxide film, 10 nm thick tungsten oxide film, 30 nm thick vanadium oxide film, 20 nm thick molybdenum oxide film, 10 nm thick cobalt oxide film, 10 nm thick niobium oxide film, 10 nm thick iron oxide film and 30 nm thick aluminum oxide film, formed by sputtering.

Example 26

A heat-resistant, light-shielding film was prepared under the same conditions as in Example 1, except that the sputtering gas was incorporated with oxygen at 10% while the oxide film was being formed. The oxide film formed on the metallic film was a low-reflectivity film having a high transmittance of 71 to 82% by itself in the visible region at a thickness of 300 nm, indicating that it massively contained oxygen deficiencies.

The heat-resistant, light-shielding film prepared was evaluated for optical characteristics and heat resistance in a manner and under conditions similar to those for Example 1. Temperature of the film surface was observed by an infrared radiation thermometer through an inspection window of quartz glass in the reel-equipped sputtering unit while the metallic film and oxide film were being sputtering-treated in the same manner as in Example 1. It was 180 to 220° C., equivalent to that observed in Example 1.

It was confirmed to have a sufficient light-shielding capacity, because it had an optical density of 4 or more. It had a higher maximum reflectivity of 7% in the visible region and surface gloss of 15% than the one prepared in Example 1, and shoed a yellowish soil color. It was also confirmed to have a surface resistance of 120Ω/□ and arithmetic average surface height Ra of 0.4 μm. It was also found to have heat resistance characteristics equivalent to those observed in Example 1, as observed in the adhesion test after it was subjected to the heat treatment test carried out at 220° C. for 24 hours, because it showed no deformation or separation of the film. The structure and characteristics of the heat-resistant, light-shielding film prepared are summarized in Table 1.

The heat-resistant, light-shielding film was subjected to a light irradiation test with light emitted from a lamp, wherein the film 5 cm in diameter was disposed 20 cm apart from a 200 W superhigh-voltage mercury lamp (UHE lamp) as a light source with a reflecting mirror, and irradiated with light for 1 hour to measure temperature rise by a radiation thermometer. Temperature rose to 85° C.

The similar tests carried out for the heat-resistant, light-shielding films prepared in Examples 1 to 25 produced a temperature rise of 190 to 200° C. Thus, the film prepared in Example 26 showed a smaller temperature rise than the others, resulting from smaller heat ray absorbed by the oxide film which covered the heat-resistant, light-shielding film and more effective reflection of the heat ray by the metallic film.

It is thus found that the heat-resistant, light-shielding film can be useful for apertures and so forth in liquid-crystal projectors working at a high temperature atmosphere of around 200° C., particularly effectively when it is used for a light-shielding member disposed on the light source lamp side.

Example 27

A heat-resistant, light-shielding film was prepared under the same conditions as in Example 1, except that oxygen content in the sputtering gas was increased to 5 to 10% while the oxide film was being formed, an oxide film having by itself a high transmittance (65 to 78%) in the visible region was used, and thickness of the oxide film was set at 10 nm.

It had the same heat resistance characteristic and light-shielding capacity as the one prepared in Example 1, but had a maximum reflectivity of 4% in the visible region and surface gloss of 7%, and turned blue to red depending on oxygen content in the sputtering gas. It was subjected to the light irradiation test carried out in a manner similar to that for Example 26. The temperature rise was 95° C., which was smaller than those observed in Examples 1 to 25. The similar trend was observed when thickness of the oxide film was set at 5 nm.

It is thus found to be useful for light-shielding members disposed on the light source lamp side.

Example 28

A heat-resistant, light-shielding film was prepared under conditions and in format similar to those for Example 1, except that the Ni-base alloy target contained Ni as the major ingredient and W at 6.9% by atom, the cooling can was kept at 0° C., and temperature of the film base surface was kept at 150° C. Temperature of the film surface was observed by an infrared radiation thermometer through an inspection window of quartz glass in the reel-equipped sputtering unit while the metallic film and oxide film were being sputtering-treated in the same manner as in Example 1. It was 150° C.

The heat-resistant, light-shielding film prepared was evaluated for optical characteristics and heat resistance in a manner and under conditions similar to those for Example 1. It was confirmed to have an optical density of 4, maximum reflectivity of 1%, surface gloss of 3% or less, surface resistance of 100Ω/□ and arithmetic average surface height Ra of 0.4 μm. It was also found that it was deformed notably in the adhesion test after it was subjected to the heat treatment test carried out at 220° C. for 24 hours. Thus, it had very poor film adhesion, to deteriorate its light-shielding capacity resulting from the separated films. It had good friction coefficients. The structure and characteristics of the heat-resistant, light-shielding film prepared are summarized in Table 1.

It produced good results in the heat treatment test carried out at 120° C. or lower for 24 hours. It is thus found that the heat-resistant, light-shielding film is unsuitable for light-shielding members working at a high temperature atmosphere of around 200° C., although useful for many optical devices working at normal temperature to around 100° C.

Example 29

Each of the heat-resistant, light-shielding films prepared in Examples 1 to 28 was punched to have a light-shielding blade, 20 by 30 mm in size and 0.01 g in weight, and the two blades were mounted in an aperture device to be tested for durability.

In the durability test, the light-shielding blades were moved in a range covering a maximum and minimum opening diameters several tens of thousand times while they were irradiated with light from a lamp to evaluate their heat and wear resistance.

The tested light-shielding blades were wear-resistant to show no change in external appearances and no wear-caused foreign matter deposited in the aperture device. Therefore, the heat-resistant, light-shielding blade brings various advantages, e.g., reduced friction, wear and noise, reduced weight resulting from use of the resin film as the base, reduced driving torque of the motor which drove them, and improved sliding characteristics.

Comparative Example 6

Light shielding blades were prepared by punching in a manner similar to that for Example 29, except that each was made of a stainless steel (SUS) foil plate. The blade was 20 by 30 mm in size and 0.3 g in weight.

The durability-tested blades showed no change in external appearances and no wear-caused foreign matter deposited in the aperture device. However, the blades needed an increased driving torque of the motor which drove them, and showed deteriorated sliding characteristics.

TABLE 1

| | Type and thickness of resin film | | | Metallic film | | | | Coated side |
|---|---|---|---|---|---|---|---|---|
| | Type | Thickness | Surface roughness (Ra) | Composition (% by mol) | Thickness | Oxide film Composition | Thickness | One side/ Both sides |
| Example 1 | PI | 75 μm | 0.5 μm | Ni—6.9W | 100 nm | Ni—W—O | 60 nm | Both sides |
| Example 2 | PI | 75 μm | 0.5 μm | Ni—6.9W | 50 nm | Ni—W—O | 50 nm | Both sides |
| Example 3 | PI | 75 μm | 0.5 μm | Ni—6.9W | 150 nm | Ni—W—O | 50 nm | Both sides |
| Example 4 | PI | 75 μm | 0.2 μm | Ni—6.9W | 100 nm | Ni—W—O | 50 nm | Both sides |
| Example 5 | PI | 75 μm | 0.8 μm | Ni—6.9W | 100 nm | Ni—W—O | 50 nm | Both sides |
| Example 6 | PI | 75 μm | 0.5 μm | Ni—6.9W | 100 nm | Ni—W—O | 50 nm | One side |
| Example 7 | PI | 75 μm | 0.5 μm | Ni—5W, Ni—14W | 100 nm | Ni—W—O | 50 nm | Both sides |
| Example 8 | PI | 75 μm | 0.5 μm | Ni—9.0Ti | 100 nm | Ni—Ti—O | 50 nm | Both sides |
| Example 9 | PI | 75 μm | 0.5 μm | Ni—6Ti, Ni—18Ti | 100 nm | Ni—Ti—O | 50 nm | Both sides |
| Example 10 | PI | 75 μm | 0.5 μm | Ni—2.3Ta | 100 nm | Ni—Ta—O | 50 nm | Both sides |
| Example 11 | PI | 75 μm | 0.5 μm | Ni—1W, Ni—5Ta | 100 nm | Ni—Ta—O | 50 nm | Both sides |
| Example 12 | PI | 75 μm | 0.5 μm | Ni—7.9V | 100 nm | Ni—V—O | 50 nm | Both sides |
| Example 13 | PI | 75 μm | 0.5 μm | Ni—6V, Ni—18V | 100 nm | Ni—V—O | 50 nm | Both sides |
| Example 14 | PI | 75 μm | 0.5 μm | Ni—9.1Al | 100 nm | Ni—Al—O | 50 nm | Both sides |
| Example 15 | PI | 75 μm | 0.5 μm | Ni—6Al, Ni—16Al | 100 nm | Ni—Al—O | 50 nm | Both sides |
| Example 16 | PI | 75 μm | 0.5 μm | Ni—6.9W | 100 nm | Ni—W—O | 50 nm | Both sides |
| Example 17 | PI | 12.5 μm | 0.5 μm | Ni—6.9W | 100 nm | Ni—W—O | 50 nm | Both sides |
| Example 18 | PI | 75 μm | 0.5 μm | Ni | 100 nm | Ni—O | 50 nm | Both sides |
| Example 19 | PI | 75 μm | 0.5 μm | Ni—6.9W | 100 nm | Ni—O | 50 nm | Both sides |
| Example 20 | PI | 50 μm | 0.5 μm | Ni—5Cu | 100 nm | Ni—Cu—O | 50 nm | Both sides |
| Example 21 | PI | 125 μm | 0.5 μm | Ni—6.9W | 250 nm | Ni—W—O | 240 nm | Both sides |
| Example 22 | PI | 125 μm | 0.5 μm | Ni—6.9W | 130 nm | Ni—W—O | 65 nm | Both sides |
| Example 23 | PI | 125 μm | 0.5 μm | Ni—6.9W | 130 nm | Ni—W—O | 65 nm | Both sides |

TABLE 1-continued

| | | | | | | | | | |
|---|---|---|---|---|---|---|---|---|---|
| Example 24 | PI | 125 μm | 0.5 μm | Ni—6.9W | 130 nm | Ni—W—O | 65 nm | Both sides | |
| Example 25 | PI | 125 μm | 0.5 μm | Ni—6.9W | 130 nm | Ni—W—O | 65 nm | Both sides | |
| Example 26 | PI | 75 μm | 0.5 μm | Ni—6.9W | 100 nm | Ni—W—O | 50 nm | Both sides | |
| Example 27 | PI | 75 μm | 0.5 μm | Ni—6.9W | 100 nm | Ni—W—O | 10 nm | Both sides | |
| Example 28 | PI | 75 μm | 0.5 μm | Ni—6.9W | 100 nm | Ni—W—O | 50 nm | Both sides | |
| Comparative Example 1 | PI | 75 μm | 0.1 μm | Ni—6.9W | 50 nm | Ni—W—O | 50 nm | Both sides | |
| Comparative Example 2 | PI | 75 μm | 1.0 μm | Ni—6.9W | 50 nm | Ni—W—O | 50 nm | Both sides | |
| Comparative Example 3 | PET, PEN, PC | 75 μm | 0.5 μm | Ni—6.9W | 100 nm | Ni—W—O | 50 nm | Both sides | |
| Comparative Example 4 | PI | 75 μm | 0.5 μm | Ni—6.9W | 100 nm | — | — | Both sides | |
| Comparative Example 5 | PI | 75 μm | 0.5 μm | Ni—6.9W | 30 nm | Ni—W—O | 50 nm | Both sides | |

| | Characteristics of light-shielding film | | | | | | |
|---|---|---|---|---|---|---|---|
| | Surface roughness (Ra) | Surface resistance (Ω/□) | Optical density | Maximum reflectivity | Surface gloss | Heat resistance | Friction coefficient |
| Example 1 | 0.4 μm | 100 | 4 or more | 1% | 3% or less | ○ | ○ |
| Example 2 | 0.4 μm | 120 | 4 or more | 1% | 3% or less | ○ | ○ |
| Example 3 | 0.3 μm | 90 | 4 or more | 1% | 3% or less | ○ | ○ |
| Example 4 | 0.1 μm | 100 | 4 or more | 1% | 3% or less | ○ | ○ |
| Example 5 | 0.7 μm | 100 | 4 or more | 1% | 3% or less | ○ | ○ |
| Example 6 | 0.4 μm | 100 | 4 or more | 1% | 3% or less | ○ | ○ |
| Example 7 | 0.4 μm | 120 | 4 or more | 1% | 3% or less | ○ | ○ |
| Example 8 | 0.3 μm | 100 | 4 or more | 1% | 3% or less | ○ | ○ |
| Example 9 | 0.3 μm | 100 | 4 or more | 1% | 3% or less | ○ | ○ |
| Example 10 | 0.3 μm | 400 | 4 or more | 1% | 3% or less | ○ | ○ |
| Example 11 | 0.3 μm | 400 | 4 or more | 1% | 3% or less | ○ | ○ |
| Example 12 | 0.4 μm | 500 | 4 or more | 1% | 3% or less | ○ | ○ |
| Example 13 | 0.4 μm | 500 | 4 or more | 1% | 3% or less | ○ | ○ |
| Example 14 | 0.3 μm | 80 | 4 or more | 1% | 3% or less | ○ | ○ |
| Example 15 | 0.3 μm | 80 | 4 or more | 1% | 3% or less | ○ | ○ |
| Example 16 | 0.3 μm | 100 | 4 or more | 1% | 3% or less | ○ | ○ |
| Example 17 | 0.4 μm | 100 | 4 or more | 1% | 3% or less | ○ | ○ |
| Example 18 | 0.3 μm | 900 | 4 or more | 1% | 3% or less | x | ○ |
| Example 19 | 0.3 μm | 100 | 4 or more | 1% | 3% or less | x | ○ |
| Example 20 | 0.4 μm | 100 | 4 or more | 1% | 3% or less | ○ | ○ |
| Example 21 | 0.4 μm | 100 | 4 or more | 1% | 3% or less | ○ | ○ |
| Example 22 | 0.4 μm | 5 | 4 or more | 2% | 3% or less | ○ | ○ |
| Example 23 | 0.4 μm | 5 | 4 or more | 2% | 3% or less | ○ | ○ |
| Example 24 | 0.4 μm | 5 | 4 or more | 2% | 3% or less | ○ | ○ |
| Example 25 | 0.4 μm | 5 | 4 or more | 2% | 3% or less | ○ | ○ |
| Example 26 | 0.4 μm | 120 | 4 or more | 7% | 15% | ○ | ○ |
| Example 27 | 0.4 μm | 110 | 4 or more | 4% | 7% | ○ | ○ |
| Example 28 | 0.4 μm | 100 | 4 or more | 1% | 3% or less | x | ○ |
| Comparative Example 1 | 0.03 μm | 120 | 4 or more | 15% | 25% | ○ | ○ |
| Comparative Example 2 | 0.9 μm | 120 | 2 | 1% | 3% or less | ○ | ○ |
| Comparative Example 3 | 0.5 μm | 150 | 3 | 2% | 5% | x | x |
| Comparative Example 4 | 0.4 μm | 100 | 4 or more | 11% | 15% | x | x |
| Comparative Example 5 | 0.4 μm | 100 | 2 | 1% | 3% or less | ○ | ○ |

What is claimed is:

1. A heat-resistant, light-shielding film comprising a heat-resistant resin film base (A) resistant to 200° C. or higher, coated, on one or both sides, with an Ni-base metallic film (B) by sputtering and then with a low-reflectivity film (C) of Ni-base oxide also by sputtering, and having a surface roughness of the low-reflectivity film (C) (arithmetic average height Ra) of 0.1 to 0.7 μm, wherein the resin film base (A) is of at least one species of resin selected from the group consisting of polyimide, aramid, polyphenylene sulfide and polyether sulfone, and has a surface roughness (arithmetic average height Ra) of 0.2 to 0.8 μm, wherein the Ni-base metallic film (B) comprises nickel as the major ingredient incorporated with at least one additive element selected from the group consisting of titanium, tantalum, tungsten, vanadium, aluminum and copper, wherein the Ni-base oxide film (C) comprises nickel as the major ingredient incorporated with at least one additive element selected from the group consisting of titanium, tantalum, tungsten, vanadium, aluminum and copper, and wherein the Ni-base metallic film (B) is 30 to 280 nm thick, and the Ni-base oxide film (C) is 5 to 250 nm thick.

2. The heat-resistant, light-shielding film according to claim 1, wherein the Ni-base metallic film (B) is incorporated with the additive element(s) at 1 to 18% by atom.

3. The heat-resistant, light-shielding film according to claim 1, wherein the Ni-base oxide film (C) is incorporated with the additive element(s) at 1 to 18% by atom.

4. The heat-resistant, light-shielding film according to claim 1, wherein the Ni-base metallic film (B) is 50 to 250 nm thick, and the Ni-base oxide film (C) is 5 to 240 nm thick.

5. The heat-resistant, light-shielding film according to claim 1, wherein the resin film base (A) is coated with the Ni-base metallic film (B) via a metal oxide gas barrier film (D) formed by sputtering.

6. The heat-resistant, light-shielding film according to claim 5, wherein the gas barrier film (D) is of Ni-base oxide film.

7. The heat-resistant, light-shielding film according to claim 6, wherein the resin film base (A) is coated with the Ni-base oxide gas barrier film (D), Ni-base metallic film (B) and Ni-base oxide film (C) formed in this order on each side, the films (D), (B) and (C) being disposed center-symmetrically on the resin film base (A).

8. The heat-resistant, light-shielding film according to claim 7, wherein the Ni-base oxide gas barrier films (D) formed on both sides of the resin film base (A) have substantially the same metallic element composition, and so are the Ni-base metallic films (B) and Ni-base oxide films (C).

9. The heat-resistant, light-shielding film according to claim 5, wherein the gas barrier film (D) is an oxide film comprising, as the major ingredient, at least one species of element selected from the group consisting of titanium, tantalum, tungsten, vanadium, molybdenum, cobalt, niobium, iron, aluminum and silicon.

10. The heat-resistant, light-shielding film according to claim 5, wherein the gas barrier film (D) is 5 to 30 nm thick.

11. A method for forming the heat-resistant, light-shielding film according to claim 5 comprising steps for supplying the heat-resistant resin film base (A) having a surface roughness (arithmetic average height Ra) of 0.2 to 0.8 μm to a sputtering unit; for sputtering the resin film base (A) with oxygen gas injected into the inert gas atmosphere to form the gas barrier film (D) thereon; for sputtering the gas barrier film (D) in an inert gas atmosphere to form the Ni-base metallic film (B) thereon; and for sputtering the Ni-base metallic film (B) with oxygen gas injected into the inert gas atmosphere to form the Ni-base oxide film (C) thereon.

12. The method according to claim 11 for forming the heat-resistant, light-shielding film, comprising additional steps for supplying the heat-resistant, light-shielding film coated with the gas barrier film (D), Ni-base metallic film (B) and Ni-base oxide film (C) on one side to a sputtering unit; and for sputtering the resin film base (A) to form the gas barrier film (D), Ni-base metallic film (B) and Ni-base oxide film (C) in this order on the other side.

13. The heat-resistant, light-shielding film according to claim 1, which has a surface resistance of 1000Ω/□ or less.

14. The heat-resistant, light-shielding film according to claim 13, which has a surface resistance of 100Ω/□ or less.

15. The heat-resistant, light-shielding film according to claim 1, wherein the resin film base (A) is coated with the Ni-base metallic film (B) and Ni-base oxide film (C) formed on each side, the films (B) and (C) being disposed center-symmetrically on the resin film base (A).

16. The heat-resistant, light-shielding film according to claim 15, wherein the Ni-base metallic films (B) formed on both sides of the resin film base (A) have substantially the same metallic element composition, and so are the Ni-base oxide films (C).

17. A method for forming the heat-resistant, light-shielding film according to claim 1 comprising steps for supplying the heat-resistant resin film base (A) having a surface roughness (arithmetic average height Ra) of 0.2 to 0.8 μm to a sputtering unit; for sputtering the resin film base (A) in an inert gas atmosphere to form the Ni-base metallic film (B) thereon; and for sputtering the Ni-base metallic film (B) with oxygen gas injected into the inert gas atmosphere to form the Ni-base oxide film (C) thereon.

18. The method according to claim 17 for forming the heat-resistant, light-shielding film, wherein pressure of the sputtering gas is kept at 0.2 to 1.0 Pa.

19. The method according to claim 17 for forming the heat-resistant, light-shielding film, wherein the resin film base (A) is kept at 180° C. or higher in the sputtering period.

20. The method according to claim 17 for forming the heat-resistant, light-shielding film, comprising additional steps for supplying the heat-resistant, light-shielding film coated with the Ni-base metallic film (B) and Ni-base oxide film (C) on one side to a sputtering unit; and for sputtering the resin film base (A) to form the Ni-base metallic film (B) and Ni-base oxide film (C) in this order on the other side.

21. The method according to claim 17 for forming the heat-resistant, light-shielding film, wherein the resin film base (A) is set on a film transfer device in the sputtering unit after being reeled into a roll.

22. A heat-resistant aperture which uses the heat-resistant, light-shielding film according to claim 1, formed into a desired shape.

23. A light intensity adjusting device which uses the heat-resistant, light-shielding film according to claim 1.

* * * * *